(12) United States Patent
Kawashima et al.

(10) Patent No.: US 7,718,995 B2
(45) Date of Patent: May 18, 2010

(54) NANOWIRE, METHOD FOR FABRICATING THE SAME, AND DEVICE HAVING NANOWIRES

(75) Inventors: Takahiro Kawashima, Osaka (JP); Tohru Saitoh, Osaka (JP); Kenji Harada, Osaka (JP)

(73) Assignee: Panasonic Corporation, Osaka (JP)

( * ) Notice: Subject to any disclaimer, the term of this patent is extended or adjusted under 35 U.S.C. 154(b) by 409 days.

(21) Appl. No.: 11/812,357

(22) Filed: Jun. 18, 2007

(65) Prior Publication Data

US 2008/0246020 A1 Oct. 9, 2008

(30) Foreign Application Priority Data

Jun. 20, 2006 (JP) .............................. 2006-170395

(51) Int. Cl.
H01L 29/06 (2006.01)
H01L 31/0328 (2006.01)
H01L 31/0336 (2006.01)
H01L 31/072 (2006.01)
H01L 31/109 (2006.01)

(52) U.S. Cl. .................. 257/24; 977/742; 977/743; 977/762; 257/E29.07

(58) Field of Classification Search ............ 257/24, 257/E29.07; 977/742, 743, 762
See application file for complete search history.

(56) References Cited

U.S. PATENT DOCUMENTS 7,087,920 B1 * 8/2006 Kamins .................. 257/2

FOREIGN PATENT DOCUMENTS

WO   WO 02/080280 A1   10/2002
WO   WO 03/005450 A2   1/2003

OTHER PUBLICATIONS

Martel, R., et al., "Single- and multi-wall carbon nanotube field-effect transistors", Applied Physics Letters, 1998, pp. 2447-2449, vol. 73, No. 17, American Institute of Physics.
Pan, L., et al., "Effect of diborane on the microstructure of boron-doped silicon nanowires", Journal of Crystal Growth, 2005, pp. 428-536, vol. 277, Elsevier.
Cao, L., et al., "Instability and Transport of Metal Catalyst in the Growth of Tapered Silicon Nanowires", Nano Letters, 2006, pp. 1852-1857, vol. 6, No. 9, American Chemical Society.
Bauer, J., et al., "Electrical properties of nominally undoped silicon nanowires grown by molecular-beam epitaxy", Applied Physics Letters, 2007, pp. 012105-1-012105-3, vol. 90, American Institute of Physics.
Sutter, E., et al., "Au-Induced Encapsulation of Ge Nanowires in Protective C Shells", Advanced Materials, 2006, pp. 2583-2588, vol. 18, Wiley-VCH Verlag GmbH & Co.

* cited by examiner

*Primary Examiner*—Thien F Tran
(74) *Attorney, Agent, or Firm*—McDermott Will & Emery LLP

(57) ABSTRACT

A nanowire according to the present invention includes: a nanowire body made of a crystalline semiconductor as a first material; and a plurality of fine particles, which are made of a second material, including a constituent element of the semiconductor, and which are located on at least portions of the surface of the nanowire body. The surface of the nanowire body is smooth.

21 Claims, 24 Drawing Sheets (a)

(b)

(c)

(a)

POINT 1

(b)

POINT 2

(a)

POINT 3

(b)

POINT 4

(a)

(b)

(c)

(a)

(b)

(c)

(a)

(b)

(c)

(a)

(b)

(a)

(b)

(c)

(a)

(b)

(c)

NANOWIRE, METHOD FOR FABRICATING THE SAME, AND DEVICE HAVING NANOWIRES

BACKGROUND OF THE INVENTION

1. Field of the Invention

The present invention relates to a nanowire in which fine particles have been formed in a self-organizing manner on the surface of a nanowire body.

2. Description of the Related Art

Researches and developments have been carried on extensively in order to reduce the feature sizes of transistors for large-scale integrated circuits (LSIs) or thin-film transistors (TFTs) for flat-panel displays. In a silicon semiconductor process, fine line patterning with a design rule of 0.1 µm or less is realized by shortening the wavelength of an exposing radiation source for a photolithographic process. However, according to the conventional photolithography technology, the feature size cannot be reduced unlimitedly. Also, as the feature size has been reduced, the costs of exposure systems and masking members have been rising steeply.

Meanwhile, carbon nanotubes (see Non-Patent Document No. 1) and nanowires made of a material with semiconductor type properties (see Patent Document No. 1) have attracted a lot of attention recently. Carbon nanotubes and nanowires are very small structures with a diameter of about 1 nm to about 1 µm and can be formed in a self-organizing manner. That is why with those carbon nanotubes or nanowires, a high-performance electronic device of a nanometer scale could be realized even without adopting those advanced photolithography or etching technologies. For that reason, those nanostructures are expected to contribute to manufacturing high-performance devices at a reduced cost without resorting to those complicated process technologies.

Hereinafter, a conventional nanowire structure will be described with reference to FIG. 20.

FIG. 20(a) schematically illustrates the structure of a nanowire. This nanowire has a length of about 500 nm to about 1 mm, which may be appropriately determined according to its application.

FIG. 20(b) shows a nanowire 201, of which the core portion 202 (as the inner portion) and the shell portion 203 (as the outer portion) are made of mutually different materials (see Patent Document No. 2). Such a nanowire will be referred to herein as a "core-shell nanowire".

FIG. 20(c) shows a nanowire 204 in which first and second semiconductor nanowires 205 and 206 are arranged in its length direction (see Patent Document No. 2). Such a nanowire will be referred to herein as a "hetero-nanowire".

According to a normal heterogrowth technology that involves an epitaxy process, the lattice constants need to match at the heterojunction in order to reduce defects and dislocations, and therefore, the types of materials available are limited. However, a nanowire with a pseudo-one-dimensional structure could relax the stress that would be caused due to a mismatch of lattice constants, thus allowing for a more flexible selection of materials.

As described above, those nanowires that could realize nanostructures or material engineering in a self-organizing manner are widely expected as promising materials.

Non-Patent Document No. 2 reports that by doping a silicon nanowire with boron, the outside diameter of the nanowire can be increased and its surface comes to get rugged and have gold-rich fine particles thereon (which are called "nanoparticles").

Patent Document No. 1: Japanese Translation of PCT International Application No. 2004-535066
Patent Document No. 2: Japanese Translation of PCT International Application No. 2004-532133
Non-Patent Document No. 1: R. Martel, et. al., "Single- and Multi-Wall Carbon Nanotube Field-Effect Transistors", Appl. Phys. Lett. 73p, p. 2447, 1998
Non-Patent Document No. 2: L. Pan, et al., "Effect of Diborane on the Microstructure of Boron-Doped Silicon Nanowires", J. Cryst. Growth 277, p. 428, 2005

Nanowires have been researched extensively recently as prospective materials for use in various applications. However, since nanowires are extremely fine structures, it is very difficult to increase their functions by performing further fine-line patterning on the surface of the nanowires.

Non-Patent Document No. 1 discloses that if a nanowire being grown is doped with a dopant, the resultant nanowire will have irregular ruggedness. However, the formation of such ruggedness is non-controllable and is hard to apply to electronic devices.

It is known that a great many fine particles could be formed on the surface of a nanowire depending on the growth conditions of the nanowire. But a technique for selectively forming such fine particles on a desired region of a nanowire is not known yet. If the formation and distribution of those fine particles on the surface of a nanowire could be controlled, then a nanowire with fine particles should be applicable to various electronic devices. Unfortunately, though, nobody has ever developed such a control technique yet as of today.

In order to overcome the problems described above, the present invention has an object of providing a nanowire in which fine particles have been formed in a self-organizing manner on the surface of a nanowire body, a device including such nanowires, and a method of making such a nanowire.

SUMMARY OF THE INVENTION

A nanowire according to the present invention includes: a nanowire body made of a crystalline semiconductor as a first material; and a plurality of fine particles, which are made of a second material, including a constituent element of the semiconductor, and which are located on at least portions of the surface of the nanowire body. The surface of the nanowire body is smooth.

In one preferred embodiment, at least those portions of the smooth surface of the nanowire body, which are in contact with the fine particles, have substantially no oxide film.

In another preferred embodiment, the nanowire has an average diameter of 1 nm to 1 µm.

In another preferred embodiment, the fine particles are dispersed over the entire surface of the nanowire body.

In another preferred embodiment, the surface of the nanowire body includes a first region in which the fine particles are dispersed and a second region in which the fine particles have not been formed.

In another preferred embodiment, the fine particles include at least one type of metallic element.

In this particular preferred embodiment, the fine particles are made of either a metal or an alloy of the metal and the first material.

In another preferred embodiment, the second material includes at least one metal that is selected from the group consisting of gold, silver, copper and iridium.

In another preferred embodiment, the fine particles have a mean particle size of less than 20 nm.

In another preferred embodiment, the nanowire body is single crystalline.

In another preferred embodiment, the first material includes at least one material that is selected from the group consisting of silicon, germanium and carbon.

A field effect transistor according to the present invention includes a nanowire according to any of the preferred embodiments of the present invention described above. The transistor includes: a channel region, which is defined in the nanowire; electrodes, which are connected to the nanowire and which function as source and drain regions; a gate electrode for controlling conductivity in at least a portion of the channel region; and a gate insulating film for electrically insulating the gate electrode from the channel region.

In one preferred embodiment, at least some of the fine particles on the surface of the nanowire are in contact with the electrodes.

In another preferred embodiment, portions of the nanowire that are in contact with the electrodes are doped with a dopant.

In another preferred embodiment, the fine particles are chemically modified with functional molecules.

In this particular preferred embodiment, the functional molecules include —SH groups at sites where the molecules are bonded to the fine particles.

In a specific preferred embodiment, the functional molecules are X—$(C_nH_m)$—SH (where n and m are natural numbers) and X is —$NH_2$, —COOH, —$C_xH_y$ or —$C_aF_b$ (where x, y, a and b are natural numbers).

A sensor according to the present invention includes: a nanowire according to any of the preferred embodiments of the present invention described above functioning as a sensing section; and first and second electrodes connected to the nanowire.

An electronic device according to the present invention includes: the nanowire in which the fine particles are chemically modified with functional molecules; and a member that is chemically bonded to the nanowire via the functional molecules.

An electronic device according to the present invention includes a nanowire according to any of the preferred embodiments of the present invention described above.

In one preferred embodiment, the electronic device further includes an electrode that contacts with the fine particles of the nanowire.

A method of making a nanowire according to the present invention includes the steps of: (A) providing a substrate including catalyst metal particles that are arranged on the surface; and (B) growing a nanowire body of a first material on the substrate. The step (B) includes growing a plurality of fine particles of a second material on at least portions of the surface of the nanowire body.

A nanowire according to the present invention includes a plurality of fine particles on the surface of a nanowire body, and therefore, contributes to realizing various types of devices using those fine particles. According to the present invention, metal particles can be formed in a self-organizing manner on the surface of the nanowire body and the nanowire can be fabricated easily. That is why such nanowires should be applicable to transistors, memories and various other electronic devices and to a variety of electronic appliances that use those electronic devices.

If such a nanowire were to be made by a conventional technique, metal particles should be made separately and then attached to the surface of nanowire body. In that case, it would be difficult to increase the bond strength between the metal particles and the nanowire or to accurately control the density and particle size of the metal particles.

It was reported that fine particles of gold could be formed while a nanowire was being grown. In that case, however, the surface of the nanowire body would have irregular ruggedness. If the nanowire body of a semiconductor had such irregular ruggedness on the surface, then crystal defects and unnecessary levels would increase so much as to deteriorate the properties of the semiconductor. According to the present invention, on the other hand, the surface of the nanowire body can be kept smooth, and therefore, excellent performance is realized.

DETAILED DESCRIPTION OF PREFERRED EMBODIMENTS

First, a nanowire according to the present invention will be described with reference to FIG. 1. Specifically, FIG. 1(a) is a perspective view of a nanowire according to the present invention, while FIG. 1(b) is a cross-sectional view of the nanowire as viewed on the plane A-A shown in FIG. 1(a).

Figure 1:
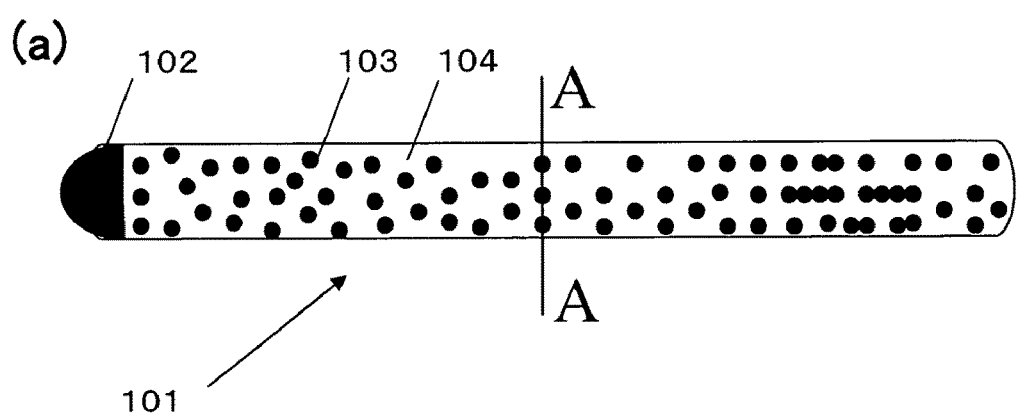
FIG. 1(a) is a side view illustrating a nanowire according to the present invention and FIG. 1(b) is a cross-sectional view of the nanowire as viewed on the plane A-A.
Figure 1:
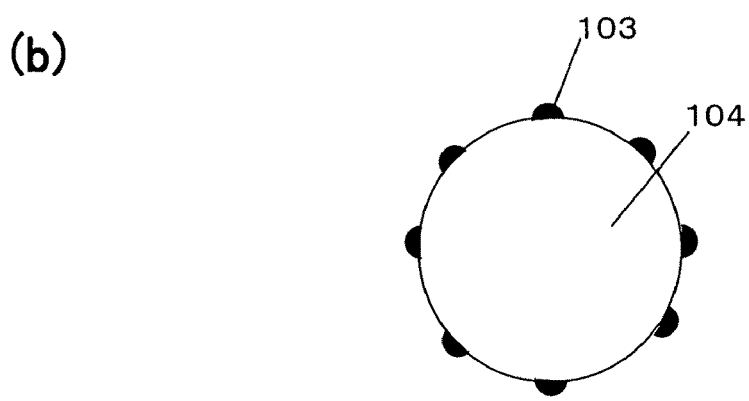

In the nanowire shown in FIG. 1, a plurality of fine particles have been formed on the surface of its nanowire body. Such a nanowire will be referred to herein as a "fine particle coated nanowire". The fine particle coated nanowire 101 shown in FIG. 1 has a catalyst metal 102 at one end of the nanowire body and has a structure in which those fine particles 103 are arranged on the surface of the nanowire body 104. The same metal is contained in the catalyst metal 102 and the fine particles 103. The catalyst metal 102 is removable after the nanowire is complete. In other words, the final fine particle coated nanowire does not have to have the catalyst metal 102. For the sake of simplicity, the catalyst metal 102 is not shown in any other drawing but FIG. 1.

The nanowire body 104 is made of a crystalline semiconductor (i.e., a first material) with a smooth surface. Examples of preferred first materials include Group IV semiconductors such as Si, Ge and SiGe, Group III-V semiconductors such as GaAs, InP and InAs, and Group II-VI semiconductors such as ZnS, ZnSe and CdS. As used herein, the "crystalline semiconductor" is preferably single crystalline but may also include some defects or may also be polycrystalline.

The catalyst metal 102 and the fine particles 103 may be either atoms of a metal such as gold, silver, copper, nickel, cobalt, iron or titanium or an alloy or a compound including any of these metal atoms and the material of the nanowire body 104.

The fine particles 103 are made of a second material including a constituent element of the semiconductor of the nanowire body 104. The fine particles 103 have a mean particle size of about 1 nm to about 50 nm, which is typically 20 nm or less. The fine particles typically have a circular or elliptical cross section but may also have a polygonal cross section or any of various other cross-sectional shapes. The fine particle coated nanowire 101 may have a length of about 1 μm to about 100 μm and a diameter of about 2 nm to about 1 μm.

In a preferred embodiment, at least those portions of the smooth surface of the nanowire body 104, which are in contact with the fine particles 103, have substantially no oxide film. As will be described later, the metal contained in the fine particles 103 derives from the catalyst metal 102 and the fine particles 103 expand their distribution as they migrate along the smooth surface of the nanowire body 104. The present inventors confirmed via experiments that this migration did not occur often when the surface of the nanowire body 104 was oxidized. That is why the fine particles 103 are preferably formed and made to migrate in an environment where the surface of the nanowire body 104 is not oxidized easily. As a result, at least in those portions of the smooth surface of the nanowire body 104 that are in contact with the fine particles 103, there is substantially no oxide film. Once such migration is done, the other portions that are not in contact with the fine particles 103 may be oxidized after that or may also be coated with an oxide film.

Hereinafter, a method of making fine particle coated nanowires according to the present invention will be described with reference to FIGS. 2(a) through 2(c), which illustrate respective process steps for making the nanowires of the present invention. The nanowires may be grown by a known vapor-liquid-solid phase (VLS) growth mechanism.

Figure 2:
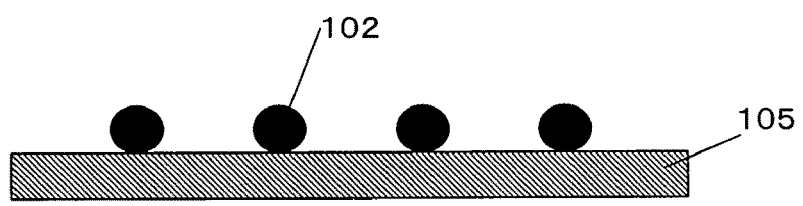
FIGS. 2(a) through 2(c) illustrate respective process steps for making the nanowire of the present invention.
Figure 2:
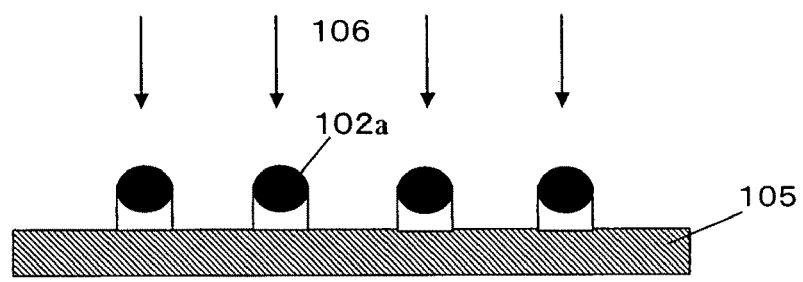
Figure 2:
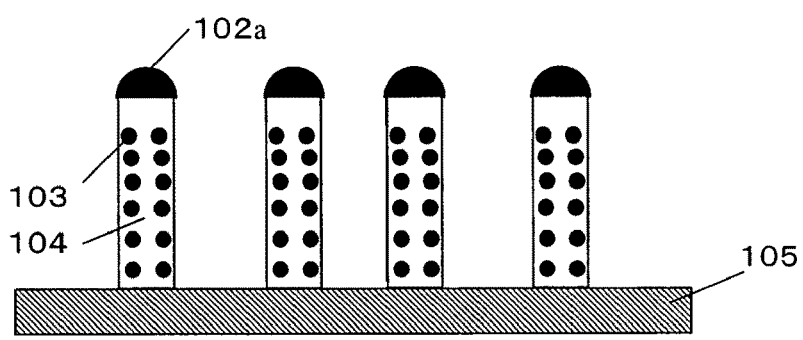

First, as shown in FIG. 2(a), a catalyst metal 102 is put on an arbitrary substrate 105. The catalyst metal 102 may be arranged by coating the substrate 105 with a metal colloid solution by a spin coating process or by depositing a metal thin film by a sputtering process or an evaporation process and then atomizing it into particles, for example.

Next, the substrate 105 with this catalyst metal 102 is loaded into the chamber of a CVD system, for example. As shown in FIG. 2(b), a source gas 106, including a constituent element of the nanowires, is introduced into the chamber and maintained at a predetermined pressure. The substrate 105 is heated by a lamp or a heater, for example, and maintained at an arbitrary temperature, which needs to be at least lower than the temperature at which the source gas 106 decomposes on the substrate 105. In such an environment, the source gas 106 selectively decomposes only in the vicinity of the catalyst metal 102. Meanwhile, the catalyst metal 102 reacts to this decomposed source gas, thereby making an alloy 102a of the catalyst metal and the constituent element of the nanowires.

Next, as shown in FIG. 2(c), the constituent element of the nanowires, which has been produced as a result of the decomposition of the source gas 106, dissolves in the alloy 102a of the catalyst metal and the constituent element of the nanowire to get the alloy 102a supersaturated. Then, the constituent element of the nanowires precipitates out of the supersaturated alloy 102a of the catalyst metal and the constituent element of the nanowires and then coagulates together, thereby growing a crystalline semiconductor (i.e., forming a nanowire body).

According to the present invention, fine particles are formed in a self-organizing manner on the surface of nanowires either while nanowires are growing or while the nanowires grown are thermally treated. To form such fine particles, the nanowire growing atmosphere needs to be controlled. For example, if nanowires are grown at a low pressure (e.g., within an atmospheric gas with a pressure of $10^{-3}$ Torr or less), fine particle coated nanowires can be formed even without doping the nanowires heavily with a dopant such as boron. Detailed growth conditions will be described later.

Hereinafter, specific preferred embodiments of the present invention will be described.

Embodiment 1

A first specific preferred embodiment of a nanowire according to the present invention will be described with reference to FIGS. 3 through 6. The nanowire of this preferred embodiment includes gold particles (which will be referred to herein as "gold dots") on a nanowire body of Si, and will be referred to herein as a "gold dot coated Si nanowire".

Figure 3:
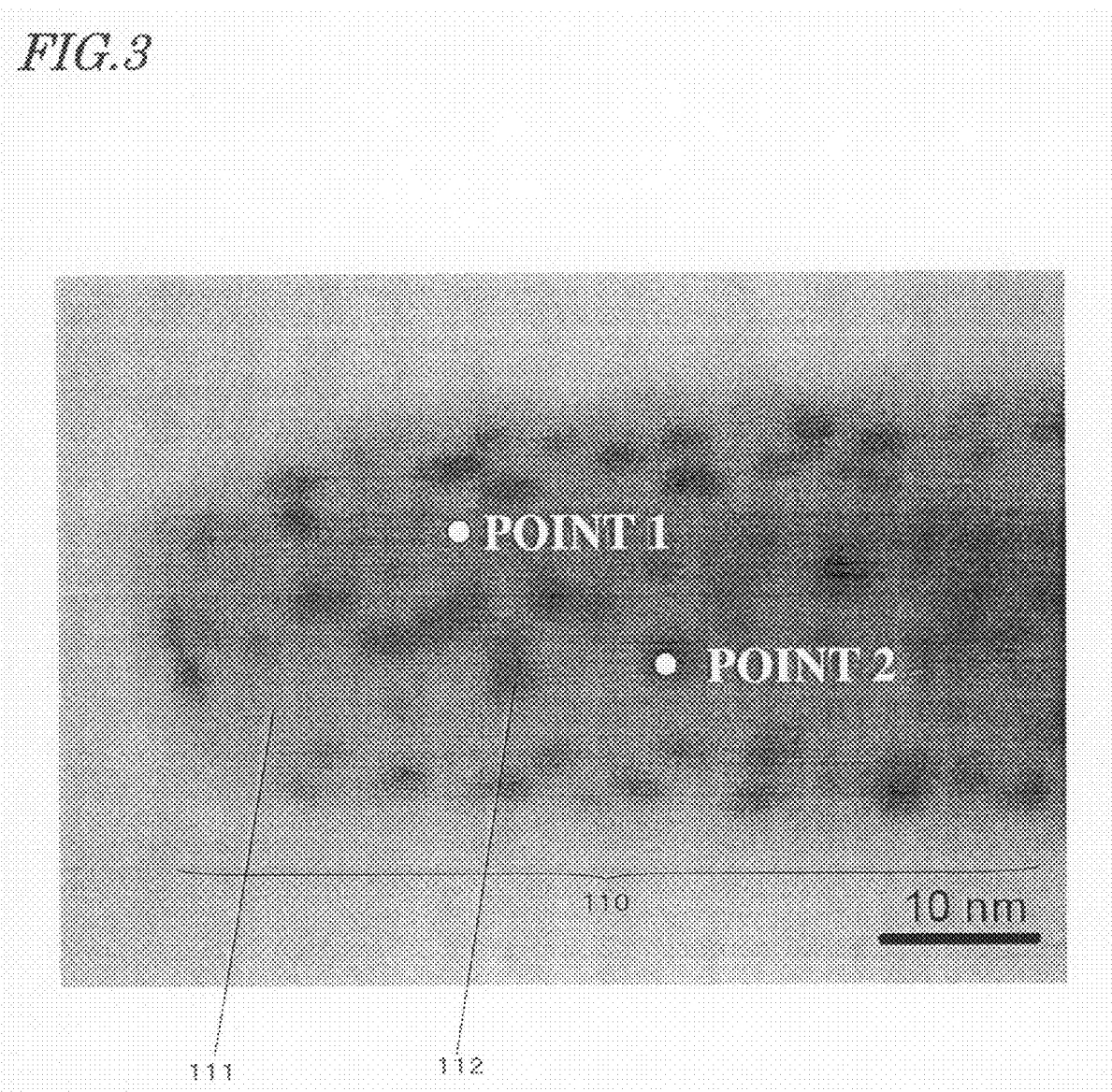
FIG. 3 is a photograph showing a TEM image of a nanowire according to a first preferred embodiment of the present invention.
Figure 4:
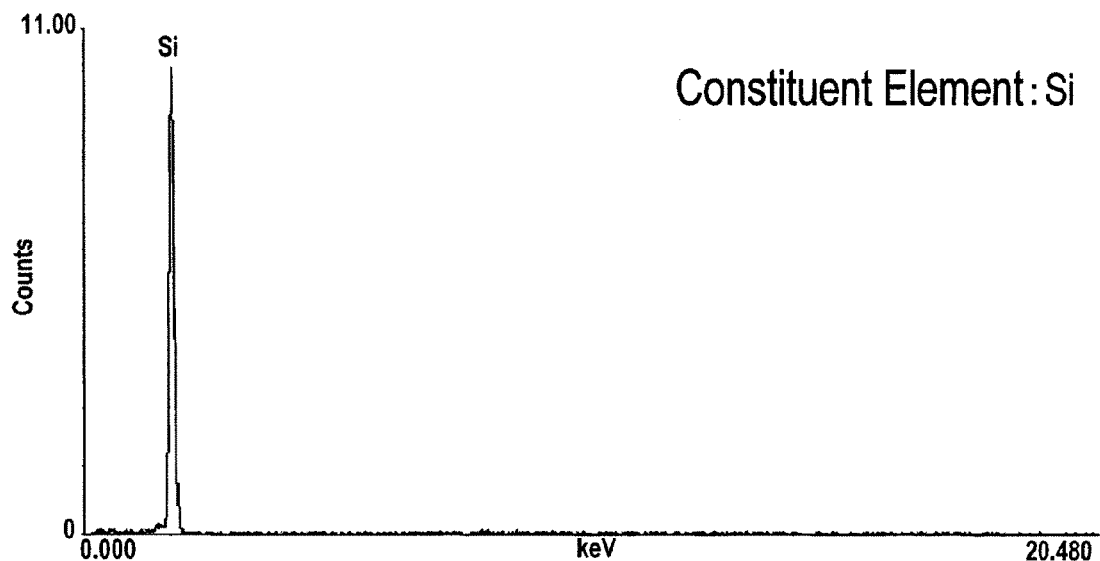
FIGS. 4(a) and 4(b) are graphs showing the results of elementary analyses that were carried out on the nanowire of the first preferred embodiment.
Figure 4:
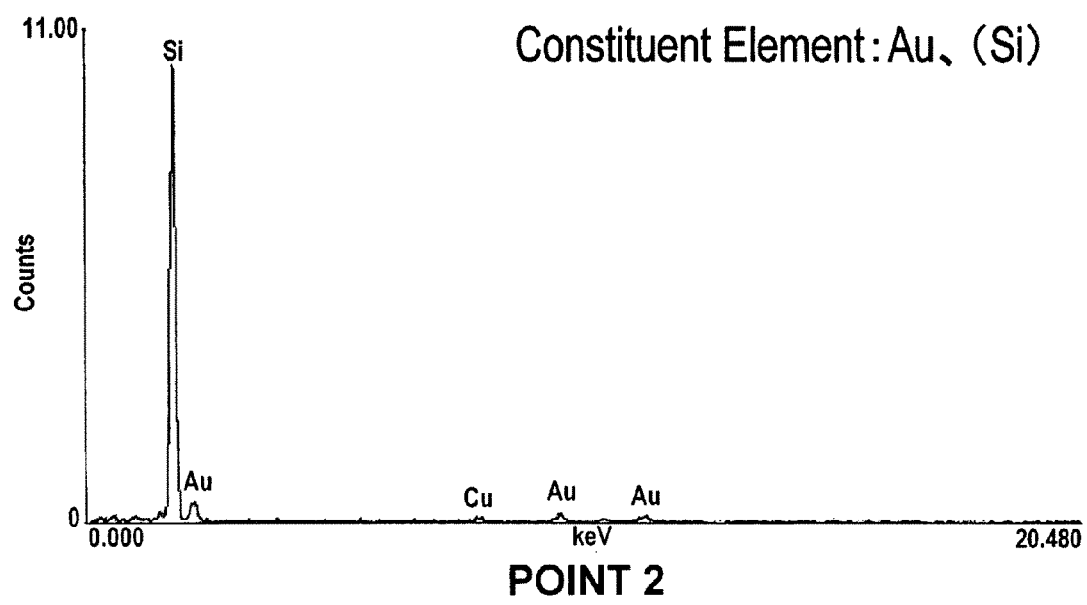

FIG. 3 is a photograph showing a transmission electron microscope (TEM) image of a gold dot coated Si nanowire 110 according to this preferred embodiment. FIGS. 4(a) and 4(b) are graphs showing the results of elementary analyses that were carried out on POINT1 and POINT2 regions, respectively, shown in FIG. 3. FIG. 5(a) is a cross-sectional TEM image showing a cross section of the gold dot coated Si nanowire as viewed on a plane that is perpendicular to the length direction of the nanowire, while FIG. 5(b) is an enlarged view showing Portion B shown in FIG. 5(a). And FIGS. 6(a) and 6(b) are graphs showing the results of elementary analyses that were carried out on POINT3 and POINT4 regions, respectively, shown in FIG. 5(b).

The gold dot coated Si nanowire 110 shown in FIG. 3 has a structure in which a number of metal particles 112 are arranged on the surface of an Si nanowire body 111. The results of elementary analyses shown in FIG. 4 reveal that the particled black dots shown in FIG. 3 are made of element gold and element silicon and the other portions are made of element silicon. That is to say, this gold dot coated Si nanowire 110 has a structure in which particles made of element gold and element silicon with particle sizes of about 2 nm to about 5 nm are formed in a self-organizing manner.

Figure 5:
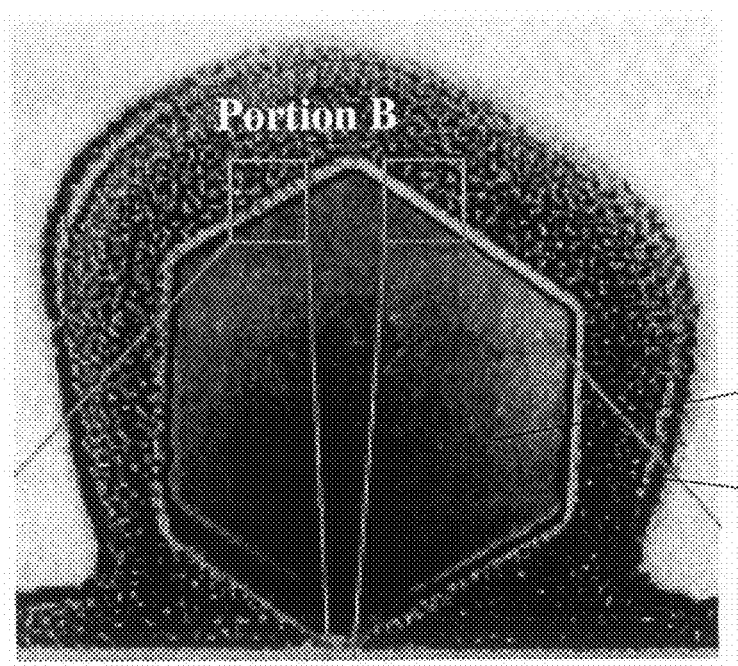
FIG. 5(a) is a photograph showing a TEM image of the nanowire of the first preferred embodiment.
FIG. 5(b) is a photograph showing a portion of the nanowire on a larger scale.
Figure 5:
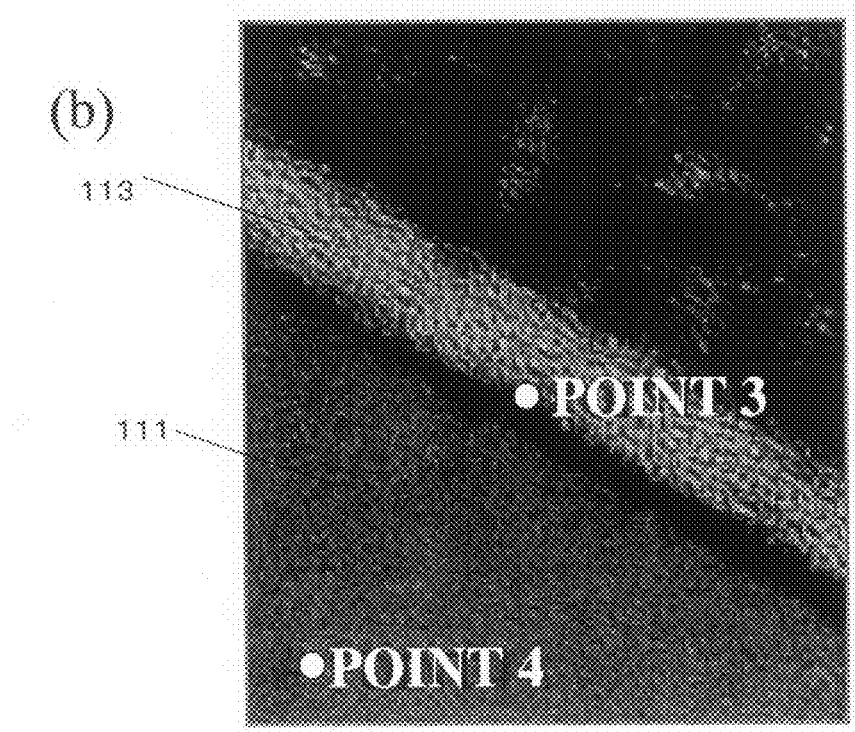
Figure 6:
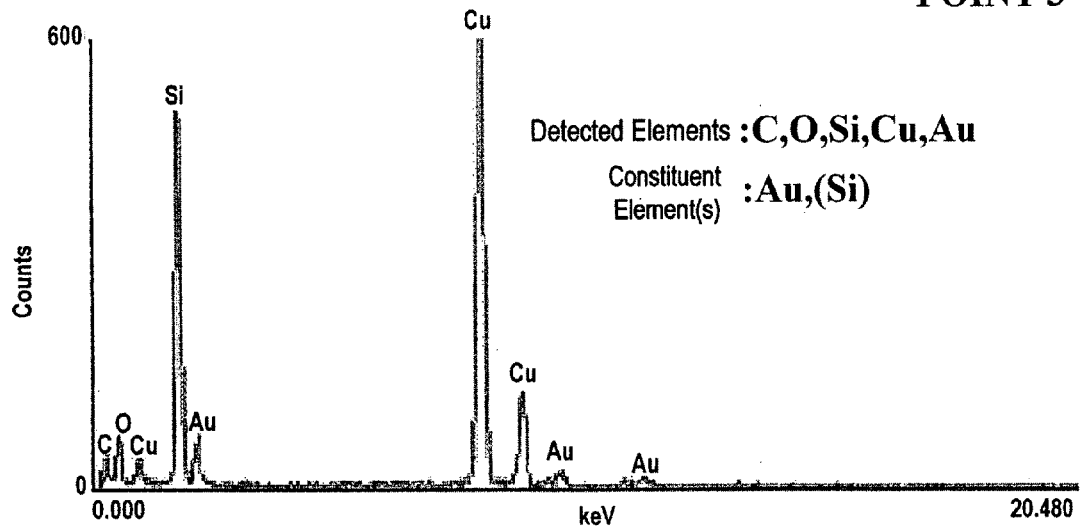
FIGS. 6(a) and 6(b) are graphs showing the results of elementary analyses that were carried out on the nanowire of the first preferred embodiment.
Figure 6:
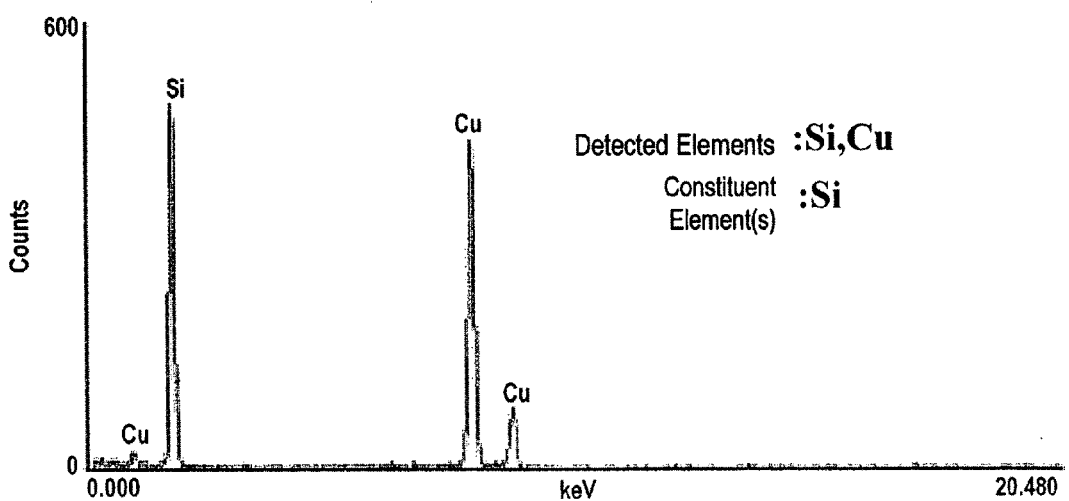

As shown in FIG. 5, the gold dot coated Si nanowire 110 typically has a hexagonal cross section and has a shape in which the Si nanowire body 111 is covered with a silicon dioxide film 113 with a thickness of about 2 nm to about 3 nm. The silicon dioxide film 113 is a natural oxide film, which would be formed by a normal bulk Si wafer when reacting to oxygen in the air. It should be noted that this silicon dioxide film 113 is formed after the metal particles 112 have been formed on the surface of the Si nanowire body 111. In other words, at least the metal particles 112 just produced are in contact with the semiconductor of the Si nanowire body 111.

As can be seen from the results of elementary analyses shown in FIGS. 6(a) and 6(b), POINT3 region shown in FIG. 5(b) is made of element gold or element silicon, while POINT4 region is made of element silicon. Therefore, it can be seen that the metal particles 112 shown in FIG. 3 are present on the surface of the Si nanowire body 111.

The gold dot coated Si nanowire, in which fine particles with very small sizes of about 2 nm to about 10 nm have been formed in a self-organizing manner on the surface of the nanowire body, is expected to be broadly applicable to transistors, memories, sensors and other electronic devices.

Hereinafter, an exemplary method of making nanowires according to this preferred embodiment will be described with reference to FIGS. 7(a) through 7(c).

Figure 7:
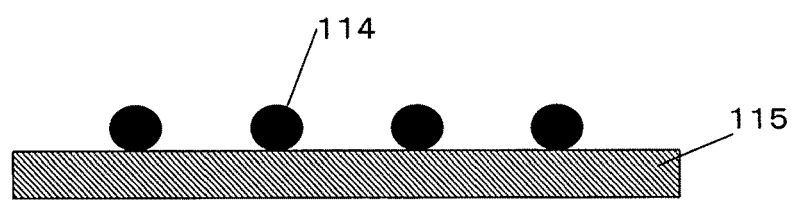
FIGS. 7(a) through 7(c) illustrate respective process steps for making the nanowire of the first preferred embodiment.
Figure 7:
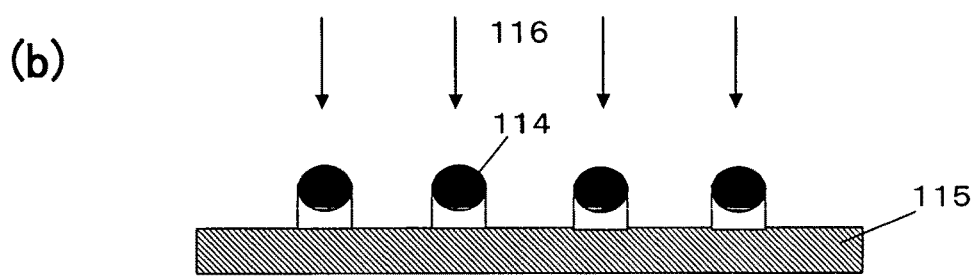
Figure 7:
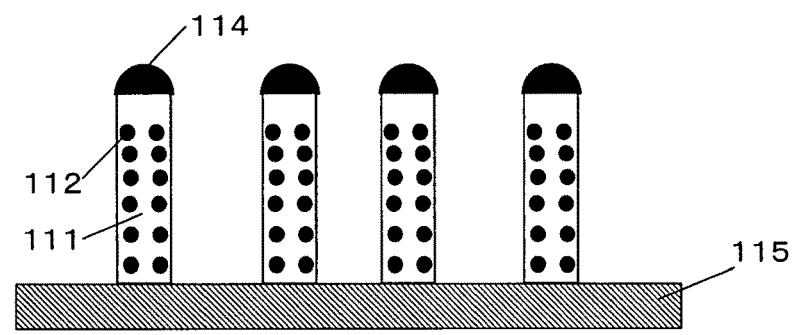

First, as shown in FIG. 7(a), a silicon wafer 115 is provided as a growth substrate and catalyst metal particles 114 are arranged on the silicon wafer 115. The growth substrate just needs to have thermal resistance that is high enough to withstand the heat treatment temperature on the nanowires growing. That is why the growth substrate may also be obtained by depositing a silicon dioxide film or a silicon nitride film on a substrate made of another semiconductor material, an insulator or a refractory metal, for example. The crystallographic plane orientation and resistivity of the growth substrate may be determined arbitrarily.

In this preferred embodiment, gold is used as the catalyst metal particles 114. The catalyst metal particles 114 have distinct ability to promote the decomposition of the source gas and are used to produce a eutectic with the constituent element of the nanowires and encourage the growth of the nanowires. The size of the catalyst metal particles 114 becomes almost equal to the diameter of the nanowires. That is why the size of the catalyst metal particles 114 is defined so as to obtain a nanowire with a desired diameter. The catalyst metal particles 114 normally have a diameter of 1 nm to 1,000 nm, and preferably have a diameter of 5 nm to 100 nm.

The catalyst metal particles 114 may be formed on the silicon wafer 115 by a known method. For example, a thin film of a catalyst metal may be deposited on the surface of the silicon wafer 115 by a sputtering process or an evaporation process in any known thin film deposition system and then thermally treated so as to coagulate by itself.

The gold particles may be formed by depositing a thin film of gold to a thickness of about 0.5 nm to about 10 nm by an EB evaporation process and then thermally treating the film at 500° C. for approximately 30 minutes to approximately three hours. The diameter of the gold particles changes with the thickness of the gold thin film and the heat treatment conditions. For that reason, the thickness of the gold thin film needs to be adjusted such that the gold particles have a desired diameter. In this preferred embodiment, a thin film of gold is deposited to a thickness of about 2 nm and then thermally treated at 500° C. for 10 minutes within a vacuum.

Thereafter, the silicon wafer 115 on which the catalyst metal particles 114 have been formed is loaded into the chamber of a CVD system, for example. Next, as shown in FIG. 7(b), a source gas 106 including element silicon is supplied into the chamber and maintained at a predetermined pressure, while the silicon wafer 115 is heated to a temperature that is lower than the decomposition temperature of the source gas 106. As a result, the constituent element of the nanowires, included in the source gas 106 that has been decomposed on the surface of the catalyst metal particles 114, reacts to the catalyst metal particles 114 on the silicon wafer 115 to make their alloy there.

As the source gas 106 for forming the silicon nanowires, $SiH_4$, $Si_2H_6$, $Si_3H_8$, $SiH_2Cl_2$ or $SiCl_4$ may be used, for example. According to this preferred embodiment, the nanowires may be grown using an ultrahigh vacuum CVD system as a CVD system, setting the wafer at a temperature of 350° C. to 500° C., using $Si_2H_6$ gas as the source gas, and adjusting the flow rate of the $Si_2H_6$ gas within the range of 10 sccm to 150 sccm such that the in-chamber pressure falls within the range of $10^{-5}$ Torr to $10^{-2}$ Torr. When these conditions are adopted, the nanowires can be grown at a rate of 50 nm/min to 300 nm/min, for example.

Next, as shown in FIG. 7(c), as the source gas 106 decomposes, silicon, which is a constituent element of the nanowires, precipitates, and the precipitated silicon atoms coagulate together, thereby growing a crystalline semiconductor layer and forming an Si nanowire body 111. During this growth process, the catalyst metal particles 114 produce eutectics with the gold particles because these particles share Si. Since such a eutectic state of gold and Si is realized at a temperature of at least approximately 360° C., the gold dot coated Si nanowires 110 are grown at a temperature higher than 360° C.

In the gold dot coated Si nanowire 110 of this preferred embodiment, while the nanowires described above are growing, gold particles (which are an example of the metal particles 112) are formed in a self-organizing manner on the surface of the Si nanowire body 111. To grow the metal particles 112 of gold or a gold-silicon alloy on the surface of the Si nanowire body 111, the nanowire growing atmosphere may be controlled. For example, the metal particles 112 may be grown at a low pressure of $10^{-3}$ Torr or less, preferably $10^{-4}$ Torr or less.

Non-Patent Document No. 2 reports that if a silicon nanowire is heavily doped with boron, gold nanoparticles will be formed on the silicon nanowire. The surface of the nanowire body disclosed in Non-Patent Document No. 2, however, has irregular ruggedness and has lost smoothness. On top of that, where the gold nanoparticles are formed, the nanowire body has a greater diameter than the other portions.

According to the manufacturing process of this preferred embodiment, even if the nanowire is not heavily doped with a dopant, the metal particles 112 can still be formed in a self-organizing manner. In addition, since the Si nanowire body 111 has a smooth surface, crystal defects are not produced easily and the properties of the semiconductor would improve. As used herein, the "smooth" surface means that the surface has only unevenness that is far smaller then the mean particle size of the fine particles on the surface. Specifically, the surface of the nanowire body preferably has unevenness of no greater than 5 nm.

Optionally, the density of the metal particles 112 may be controlled by adjusting the nanowire growing atmosphere. For example, the lower the in-chamber pressure during the nanowire growth, the higher the density of the metal particles 112 can be.

Hereinafter, it will be described in further detail exactly how the metal particles 112 are formed.

Figure 21A:
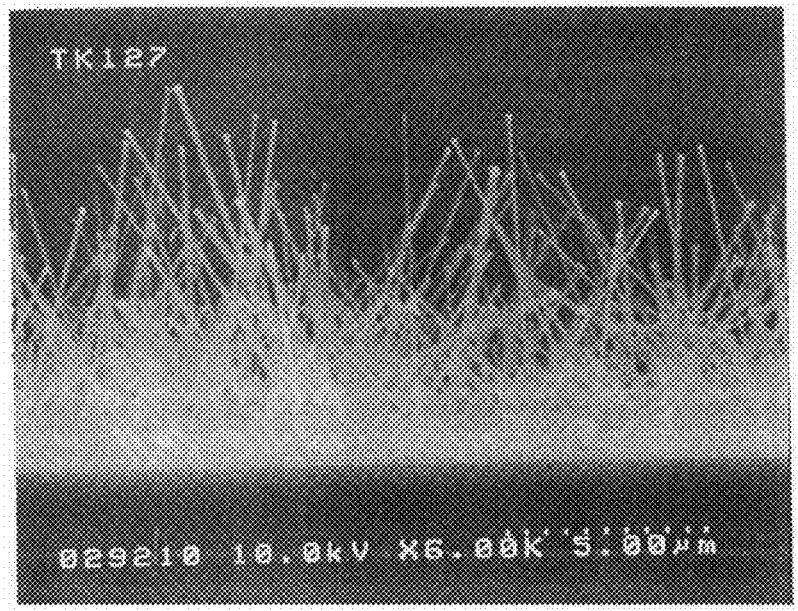
FIG. 21A is an SEM photograph showing silicon nanowires that were grown at an atmospheric gas pressure of 0.2 Torr.
Figure 21B:
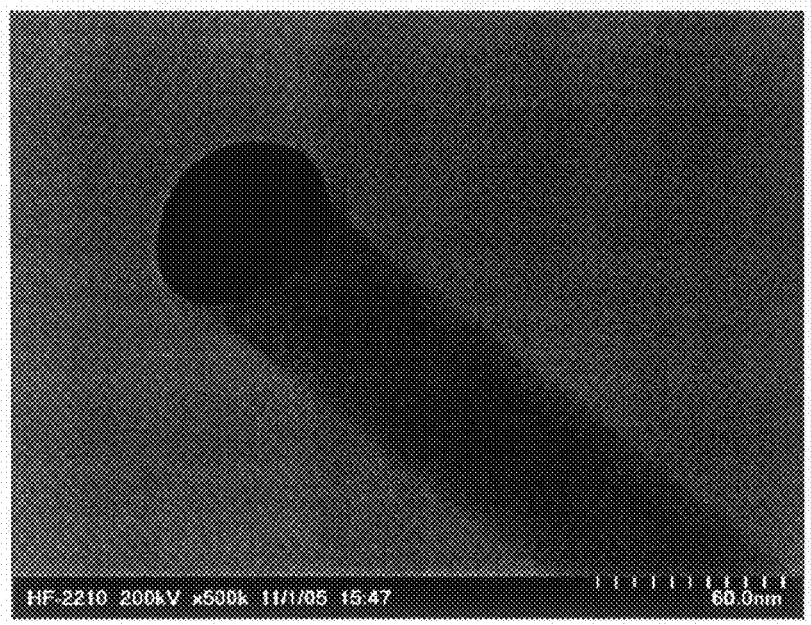
FIG. 21B is a cross-sectional TEM photograph showing a silicon nanowire that was grown at an atmospheric gas pressure of 0.2 Torr.
Figure 22A:
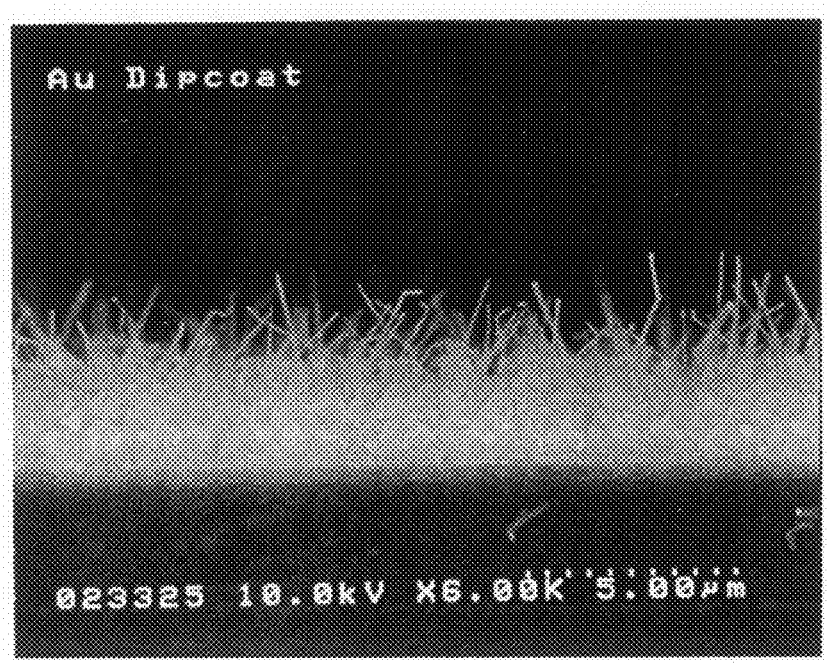
FIG. 22A is an SEM photograph showing silicon nanowires that were grown at an atmospheric gas pressure of 0.01 Torr.
Figure 22B:
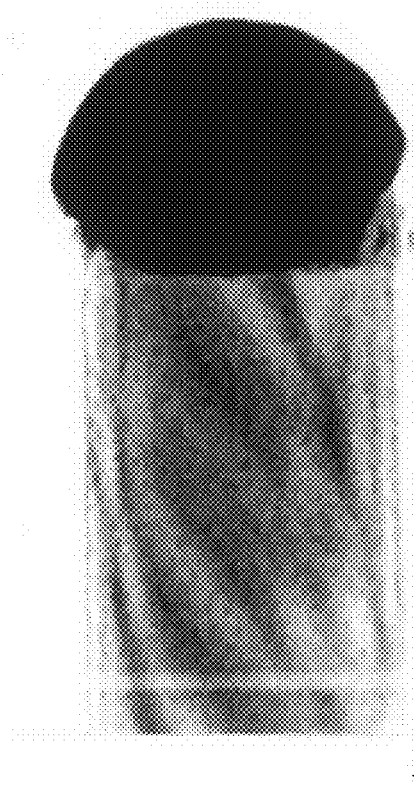
FIG. 22B is a cross-sectional TEM photograph showing a silicon nanowire that was grown at an atmospheric gas pressure of 0.01 Torr.

Look at FIGS. 21A through 22B, first. FIGS. 21A and 21B are photographs showing silicon nanowires that were grown at an atmospheric gas pressure of 0.2 Torr. FIGS. 22A and 22B are photographs showing silicon nanowires that were grown at an atmospheric gas pressure of 0.01 Torr. The photos of FIGS. 21A and 22A, showing a lot of nanowires, were shot with an SEM, while the photos of FIGS. 21B and 22B, showing a single nanowire on a larger scale, were shot with a TEM.

It can be seen that no fine particles were observed in FIG. 21B on the surface of the nanowire body but that a lot of fine particles are distributed in FIG. 22B on the surface of the nanowire body.

In FIGS. 21A and 21B, the nanowires grew at a rate of approximately 1 μm/min. On the other hand, in FIGS. 22A and 22B, the nanowires grew at a rate of approximately 0.2 μm/min. In this manner, the growth rate changes significantly with the pressure of the atmospheric gas during the growth process. That is to say, the lower the atmospheric gas pressure, the lower the growth rate of the nanowires.

The atmospheric gas includes the source gas at a predetermined partial pressure (of $10^{-3}$ Torr to $10^{-6}$ Torr, for example). The difference in the atmospheric gas pressure depends on the pressure of a carrier gas, which is typically $H_2$.

As the atmospheric gas pressure increases with a rise in the pressure of the carrier gas, the molecules of the source gas have shorter and shorter mean free path. As a result, the source gas molecules will collide against the eutectic catalyst metal more and more frequently per unit time. That is why supposing the partial pressure of the source gas is constant, the higher the atmospheric gas pressure (or carrier gas pressure), the higher the growth rate of the nanowires.

The fine particles are formed on the surface of the nanowire body when the atmospheric gas pressure is low. This should be because a smaller amount of Si is supplied to the eutectic catalyst metal during the nanowire growing process. As a result, the Si concentration decreases, but gold becomes excessive, in the catalyst metal. Then, the excessive gold particles would leave the catalyst metal and migrate along the surface of the nanowire body.

As described above, the formation of the fine particles can be controlled by adjusting the atmospheric gas pressure during the nanowire growing process. For example, if the atmospheric gas pressure is decreased to 0.1 Torr or less, the production of the fine particles can be promoted. On the other hand, if the atmospheric gas pressure is increased beyond 0.1 Torr, the formation of the fine particles can be reduced significantly or even eliminated. Also, if the atmospheric gas pressures are changed halfway through the nanowire growing process, then fine particles can also be formed selectively only on a particular portion of a single nanowire. That is to say, a nanowire with a hetero structure, in which a portion including those fine particles at the surface and a portion including no fine particles at the surface are connected together, can be obtained.

Figure 23A:
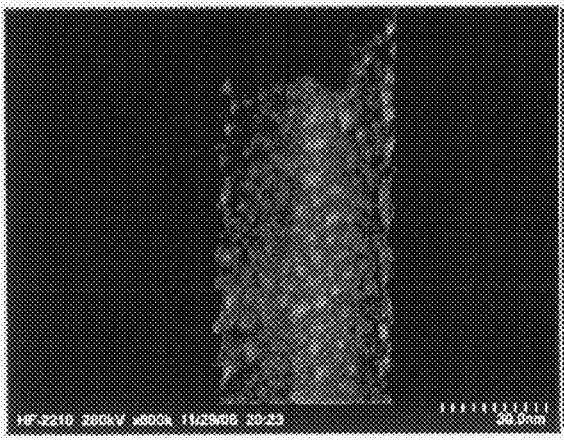
FIG. 23A is a zoomed-in TEM photograph showing a sample that was annealed at 450° C. for 10 minutes within an ultrahigh vacuum (UHV).
Figure 23B:
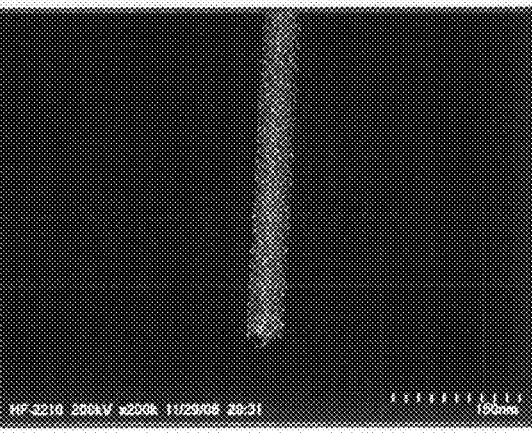
FIG. 23B is a zoomed-out TEM photograph showing the sample that was annealed at 450° C. for 10 minutes within the ultrahigh vacuum (UHV).
Figure 24A:
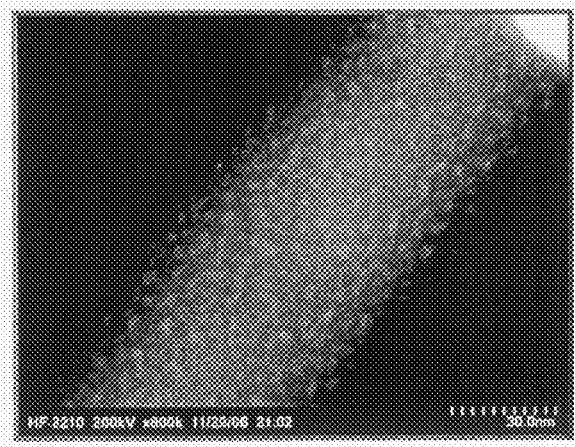
FIG. 24A is a zoomed-in TEM photograph showing a sample that was annealed at 450° C. for 10 minutes within a low vacuum of 0.3 Torr.
Figure 24B:
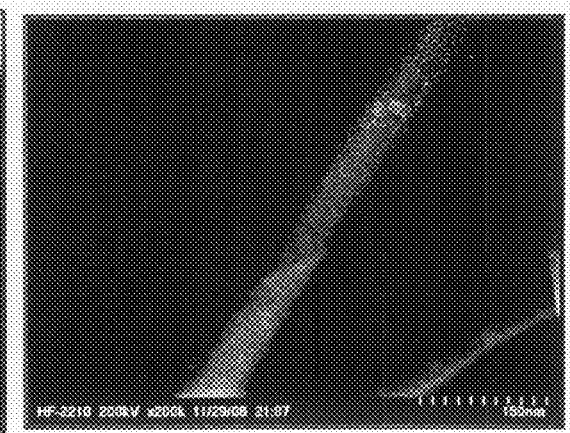
FIG. 24B is a zoomed-out TEM photograph showing the sample that was annealed at 450° C. for 10 minutes within the low vacuum of 0.3 Torr.

FIGS. 23A through 24B show how the nanowire, which had no fine particles at all just after its growth as shown in FIG. 21B, looked after having been thermally treated. Specifically, FIGS. 23A and 23B are TEM photographs (dark-field images) of a sample that was annealed at 450° C. for 10 minutes within an ultrahigh vacuum (UHV). On the other hand, FIGS. 24A and 24B are TEM photographs (dark-field images) of a sample that was annealed at 450° C. for 10 minutes within a low vacuum of 0.3 Torr.

As can be seen from FIGS. 23B and 24B, the migration distance of the fine particles is changeable according to a difference in the pressure of the atmospheric gas during the annealing process. Specifically, the higher the atmospheric gas pressure during the annealing process, the longer the migration distance of the fine particles and the more broadly the fine particles can be distributed on the surface of the nanowire body.

Figure 25A:
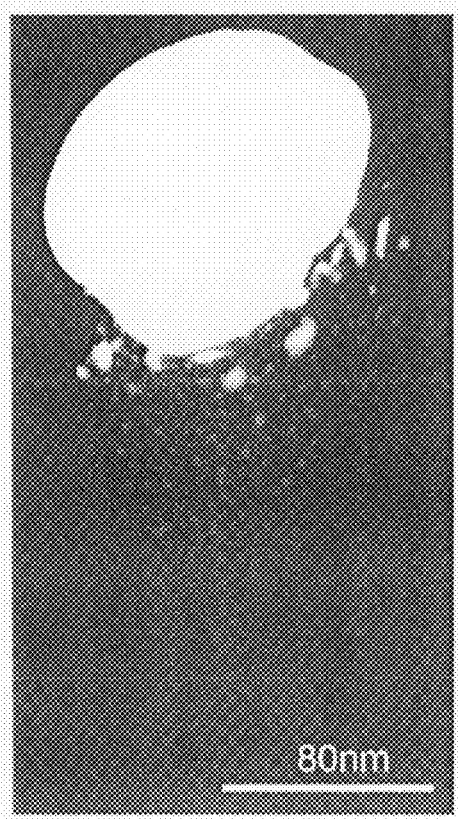
FIG. 25A is a zoomed-in TEM photograph showing a sample that was annealed at 450° C. for 10 minutes at the atmospheric pressure within a nitrogen atmosphere after having been exposed to the air.
Figure 25B:
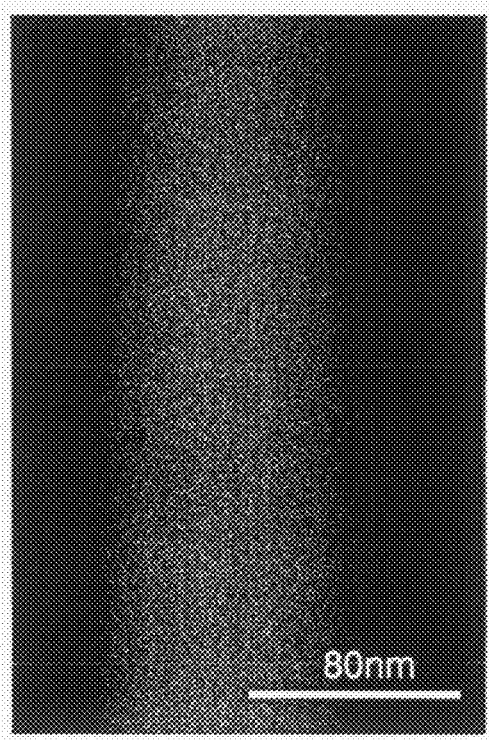
FIG. 25B is a zoomed-out TEM photograph showing a sample that was annealed at 450° C. for 10 minutes at the atmospheric pressure within a nitrogen atmosphere after having been exposed to the air.

It should be noted that this annealing process is carried out continuously with the growing process in the growing system without exposing the nanowire body grown to the air. If the nanowire body grown were exposed to the air, a natural oxide film would be formed on the surface of the nanowire body and it would be difficult to make the fine particles migrate through the annealing process. FIGS. 25A and 25B are TEM photographs (dark-field images) showing a sample that was annealed at 450° C. for 10 minutes at the atmospheric pressure within a nitrogen atmosphere after having been exposed to the air. As can be seen from FIGS. 25A and 25B, even if the nanowire is annealed after having been exposed to the air, the distribution of the fine particles does not expand but there are just a small number of fine particles in the vicinity of the catalyst metal shown in FIG. 25A.

For that reason, if the fine particles are formed after the nanowire has been grown, not while it is growing, care needs to be taken lest the surface of the nanowire body should be oxidized.

The annealing process for forming the fine particles after the nanowire has been grown needs to be carried out at a temperature that is equal to or higher than the temperature at which the semiconductor of the nanowire body and the catalyst metal form eutectics. Specifically, the gold dot coated Si nanowire is preferably annealed at a temperature of 360° C. to 750° C. The upper limit of the annealing temperature should be 750° C. because gold starts to vaporize once the annealing temperature has exceeded 750° C.

In this preferred embodiment, the metal particles 112 of gold are formed on the surface of the Si nanowire 111. Alternatively, non-gold metal particles 112 may be formed on the surface of the Si nanowire body 111. By using a catalyst metal that is made of the same material as the metal particles 112 to be formed on the surface of the Si nanowire body 111, desired metal particles 112 can be formed.

The constituent materials of the nanowire body may be changed by changing the source gases. For example, to grow a germanium nanowire, a germane gas may be used as the source gas.

As described above, those particles can be deposited on the surface of the nanowire body of a conventional nanowire being formed even without adding any special manufacturing process step. Also, by changing the growth conditions of the nanowire, the density of the particles can be controlled. That is to say, fine metal particles can be formed easily on the surface of a nanowire body using a known nanowire growing system and the density of those particles is controllable, too. For that reason, the present invention is expected to be broadly applicable to transistors, memories and various other electronic devices.

Embodiment 2

Figure 8:
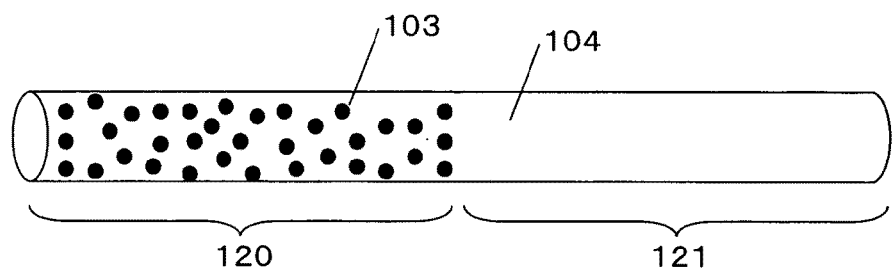
FIGS. 8(a) through 8(c) schematically illustrate the structure of a nanowire according to a second preferred embodiment of the present invention.
Figure 8:
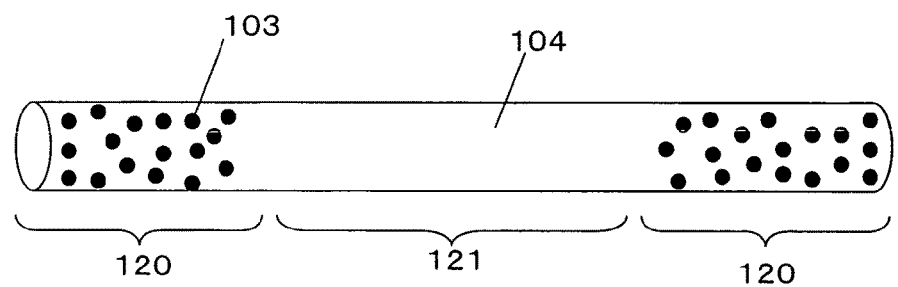
Figure 8:
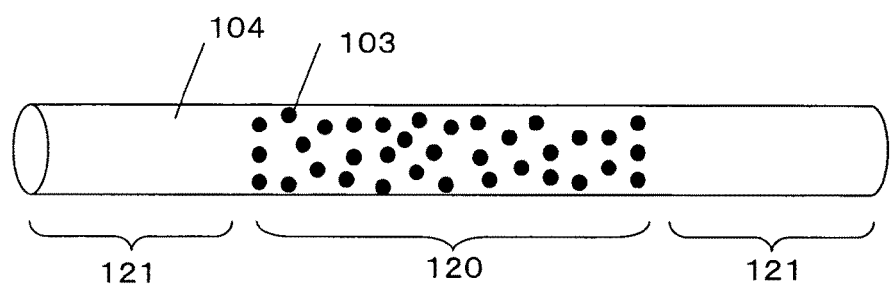

Hereinafter, a second preferred embodiment of a nanowire according to the present invention will be described with reference to FIGS. 8 through 10. The nanowire of this preferred embodiment is a hetero metal particle coated nanowire.

FIG. 8(a) is a perspective view illustrating the structure of a hetero metal particle coated nanowire. FIG. 8(b) is a perspective view illustrating the structure of a hetero metal particle coated nanowire including metal particles at both ends thereof. And FIG. 8(c) is a perspective view illustrating the structure of a hetero metal particle coated nanowire including no metal particles at either end thereof. FIG. 9(a) is a TEM photograph of a hetero gold particle coated nanowire. FIG. 9(b) is a TEM photograph showing Portion X of FIG. 9(a) on a larger scale. And FIG. 9(c) is a TEM photograph showing Portion Y of FIG. 9(a) on a larger scale. FIGS. 10(a), 10(b) and 10(c) are graphs showing the results of elementary analyses that were carried out on POINT1, POINT2 and POINT3 regions shown in FIG. 9, respectively.

As shown in FIG. 8(a), the hetero metal particle coated nanowire of this preferred embodiment can be divided into a region 120 in which metal particles 112 are present on the surface of a nanowire body 104 and a region 121 in which there are no metal particles 112. The region 121 with no metal particles has the same structure as a conventional nanowire.

The hetero metal particle coated nanowire shown in FIG. 8(b) has the same structure as the counterpart shown in FIG. 8(a) except that the former has two regions 120 with the metal particles 112 at both ends of its nanowire body 104.

The hetero metal particle coated nanowire shown in FIG. 8(c) is different from the counterpart shown in FIG. 8(a) in that the former has two regions 121 with no metal particles 112 at both ends of its nanowire body 104.

Figure 9:
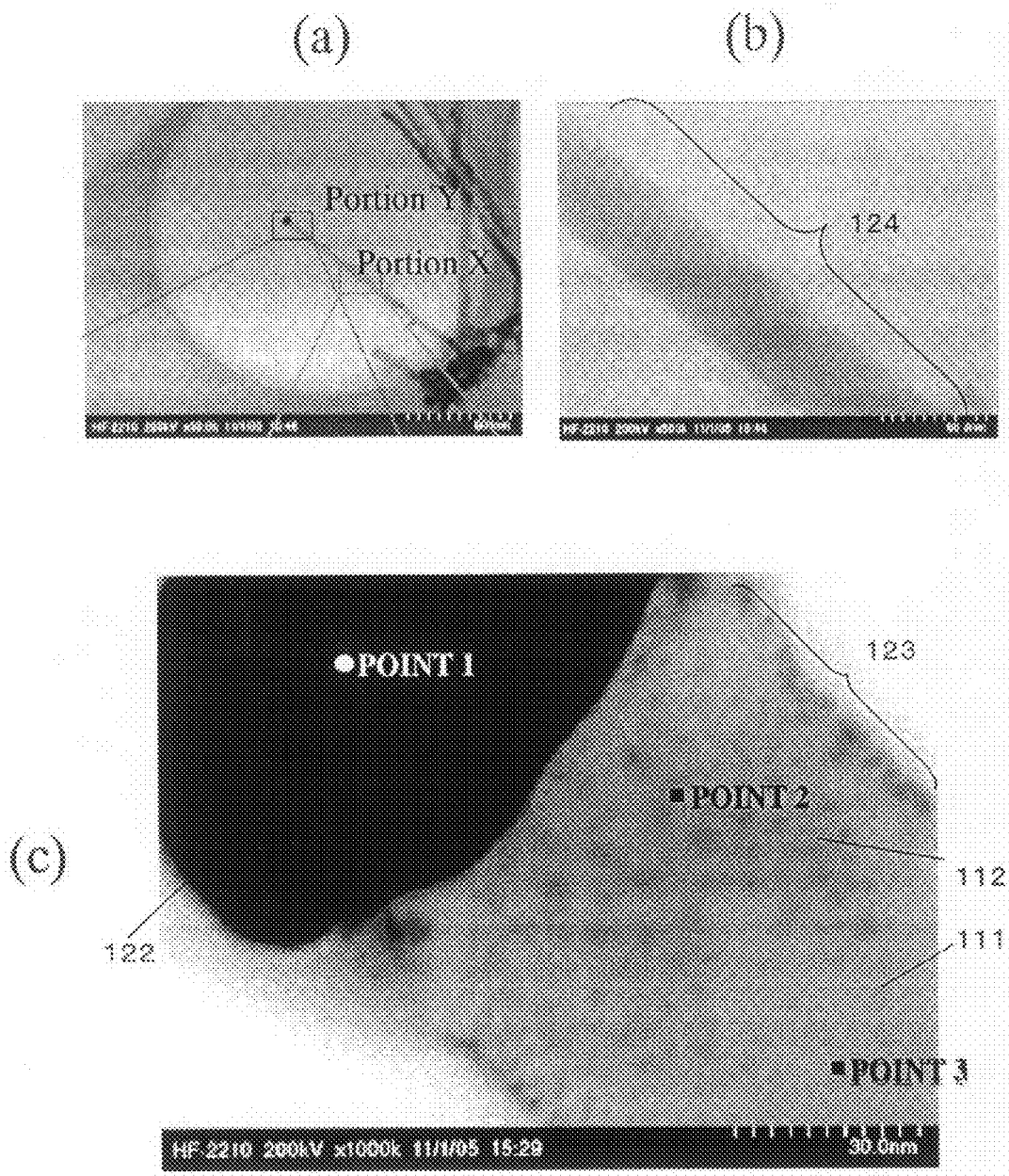
FIGS. 9(a) through 9(c) are photographs showing TEM images of the nanowire of the second preferred embodiment.
Figure 10:
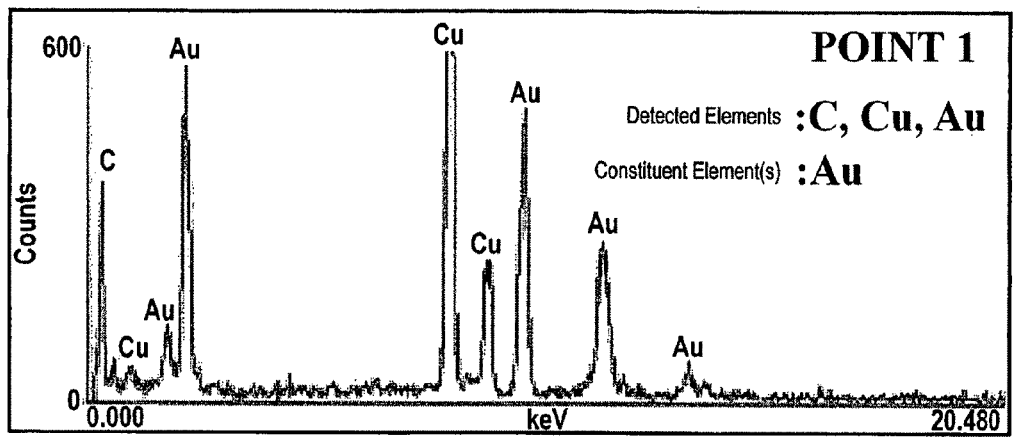
FIGS. 10(a) through 10(c) are graphs showing the results of elementary analyses that were carried out on the nanowire of the second preferred embodiment.
Figure 10:
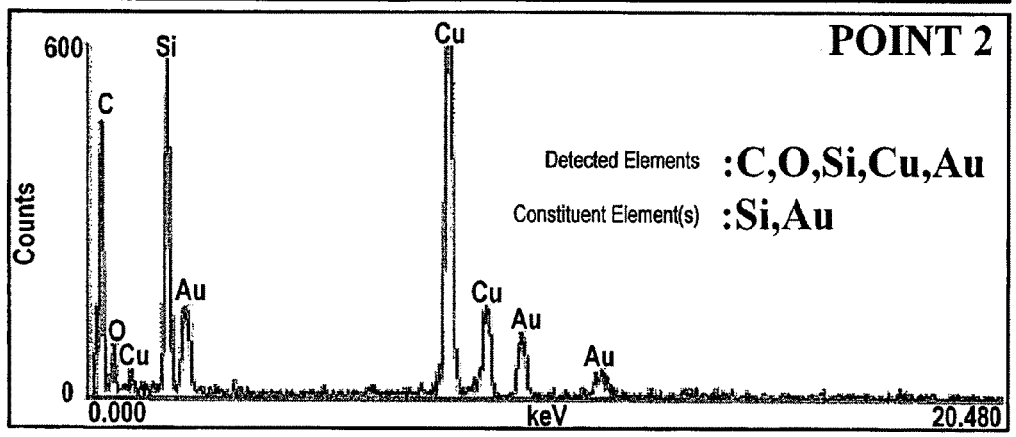
Figure 10:
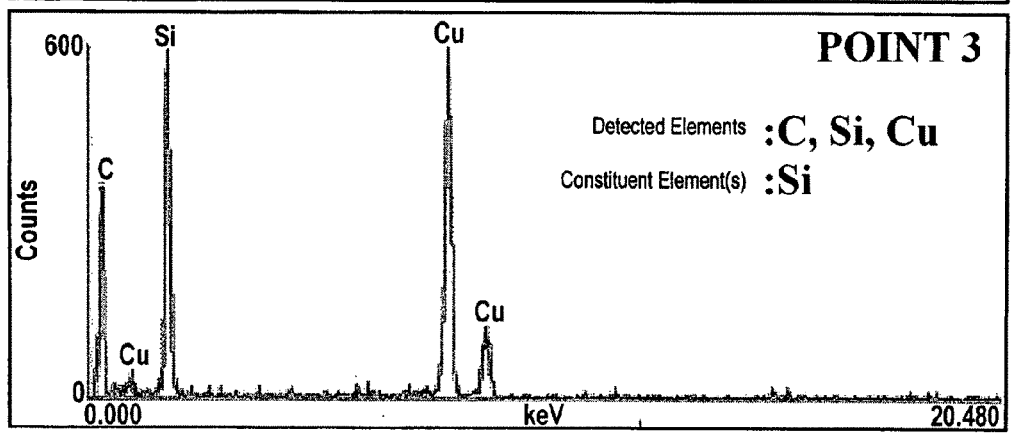

FIGS. 9(a) through 9(c) are TEM photographs of a hetero gold coated Si nanowire in which gold particles are arranged on the surface of a silicon nanowire body. As can be seen from FIG. 9, Portion Y of the hetero gold coated Si nanowire has a region 123 with gold dots in the vicinity of a gold catalyst 122 and Portion X thereof has the same structure as a conventional nanowire.

The results of elementary analyses shown in FIGS. 10(a) through 10(c) reveal that the POINT1 region (gold catalyst 122) was made of gold element, the POINT2 region (gold particles 112) was made of element gold and element silicon, and the POINT3 region (Si nanowire body 111) was made of element silicon. The gold particles have sizes of about 2 nm to about 10 nm.

In this manner, a region in which fine metal particles with very small sizes of about 2 nm to about 10 nm are formed in a self-organizing manner and a region with no such metal particles can be arranged on a single nanowire body. Such a nanowire is also expected to be broadly applicable to transistors, memories, sensors and various other electronic devices.

Next, a method of making a nanowire according to this preferred embodiment will be described.

The nanowire of this preferred embodiment may be made by the manufacturing process of the gold dot coated Si nanowire that has already been described for the first preferred embodiment. Hereinafter, a manufacturing process according to this preferred embodiment will be described.

First, gold particles are formed on a silicon wafer by the same method as that adopted in the first preferred embodiment, for example. Next, the growing substrate is loaded into the chamber of a CVD system. Specifically, $Si_2H_6$ gas may be supplied into the chamber as a source gas including element silicon and maintained at a pressure of approximately $10^{-4}$ Torr and the substrate may be heated to 450° C., thereby growing a gold dot coated Si nanowire. The nanowire can be grown to a desired length by adjusting the growing process time. When the conditions described above are adopted, a growth rate of 50 nm/min to 300 nm/min is realized, for example.

Next, after the gold dot coated Si nanowire has been grown to a desired length, a conventional Si nanowire is grown without a break. This hetero growth may be produced by maintaining the in-chamber pressure at about $10^{-2}$ Torr with the flow rate of $Si_2H_6$, a source gas, increased or with $H_2$ gas introduced into the chamber. In this manner, the conventional Si nanowire can be grown.

In this preferred embodiment, a gold dot coated Si nanowire is formed on the growing substrate first, and then a conventional Si nanowire is grown. However, by controlling the in-chamber pressure, this order may be changed or a plurality of gold dot coated regions may be defined on a single nanowire.

Also, in this preferred embodiment, silicon is used as a nanowire material and gold is used as a metal particle material. However, the nanowire and metal particle materials may be changed by changing source gases and catalyst metals for the nanowire.

As described above, according to this preferred embodiment, a metal particle coated nanowire, in which metal particles with very small sizes of about 2 nm to about 10 nm have been formed in a self-organizing manner on the surface of a nanowire body, and a conventional nanowire can be grown continuously as a single nanowire without performing any additional process. That is to say, those fine metal particles can be self-formed anywhere on a nanowire by the conventional nanowire growing process. For that reason, the present invention is expected to be broadly applicable to various electronic devices.

Embodiment 3

Hereinafter, a preferred embodiment of a field effect transistor according to the present invention will be described with reference to FIGS. 11 through 13. This transistor includes a nanowire, of which the contact regions to make electrical contact with electrodes are doped with a dopant and which includes metal particles thereon. Such a nanowire will be referred to herein as a "contact-doped hetero metal particle coated nanowire".

FIG. 11(a) is a perspective view illustrating a contact-doped hetero metal particle coated nanowire 130 according to this preferred embodiment and FIG. 11(b) is a cross-sectional view of the nanowire as viewed on the plane B-B shown in FIG. 11(a). FIG. 12 is a perspective view of a transistor that uses the contact-doped hetero metal particle coated nanowires 130 (which will be simply referred to herein as a "nanowire transistor"). FIG. 13(a) is a top view of the nanowire transistor shown in FIG. 12 and FIG. 13(b) is a cross-sectional view of the transistor as viewed on the plane C-C shown in FIG. 13(a).

Figure 11:
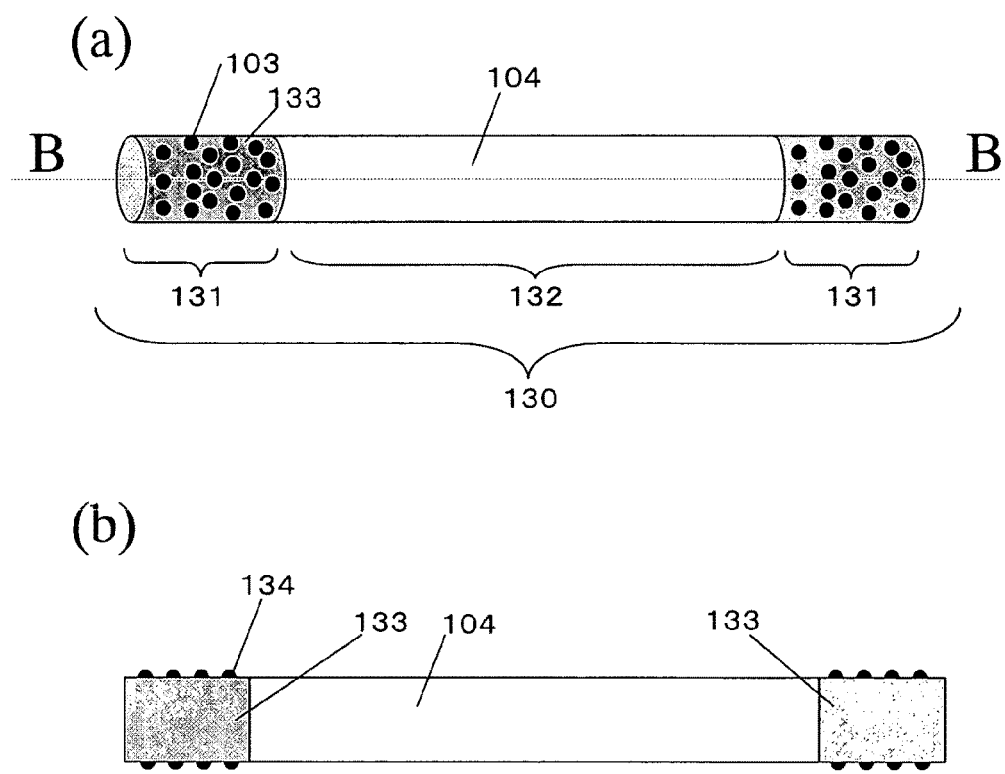
FIG. 11(a) schematically illustrates the structure of a nanowire according to a third preferred embodiment of the present invention and FIG. 11(b) is a cross-sectional view of the nanowire as viewed on the plane B-B.

Just like the hetero metal particle coated nanowire shown in FIG. 8(b), the contact-doped hetero metal particle coated nanowire 130 shown in FIG. 11 has its both ends coated with metal particles. But unlike the hetero metal particle coated nanowire shown in FIG. 8(b), both ends (i.e., the metal particle coated regions 131) of the nanowire 130 are doped with a dopant and can function as contact regions. If the nanowire is made of silicon, for example, the metal particle coated regions 131 may be doped with a Group III element such as boron or a Group V element such as phosphorus or arsenic at a dose of about $1\times10^{18}$ atoms/cm$^{-3}$ to about $1\times10^{20}$ atoms/cm$^{-3}$. Also, the metal particles 134 on the metal particle coated regions 131 are preferably made of an alloy of the nanowire material and a metal. For example, if the nanowire is made of silicon, the metal particles 134 are preferably made of an alloy such as nickel silicide or titanium silicide.

Figure 12:
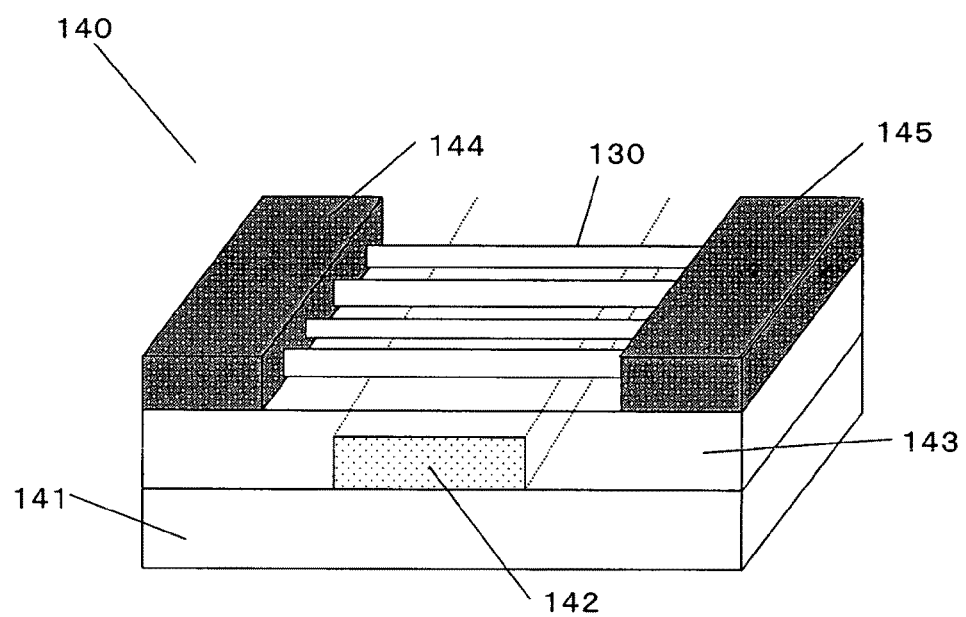
FIG. 12 is a perspective view illustrating the structure of a nanowire transistor according to the third preferred embodiment.
Figure 13:
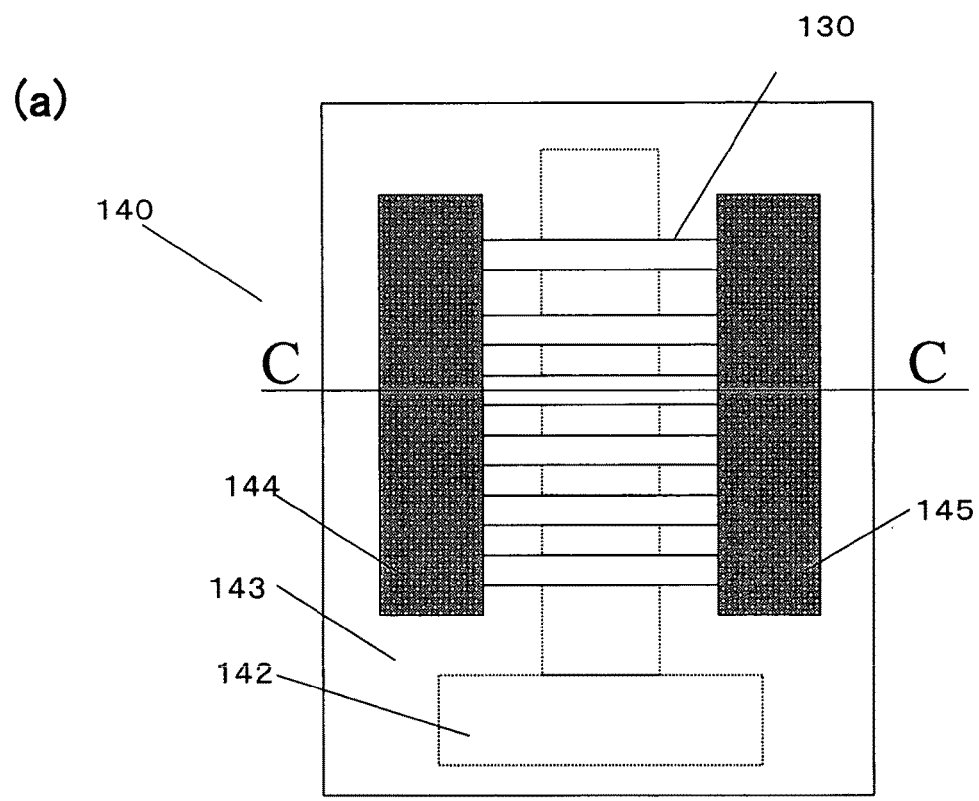
FIG. 13(a) is a top view of the nanowire transistor of the third preferred embodiment and FIG. 13(b) is a cross-sectional view of the transistor as viewed on the plane C-C.
Figure 13:
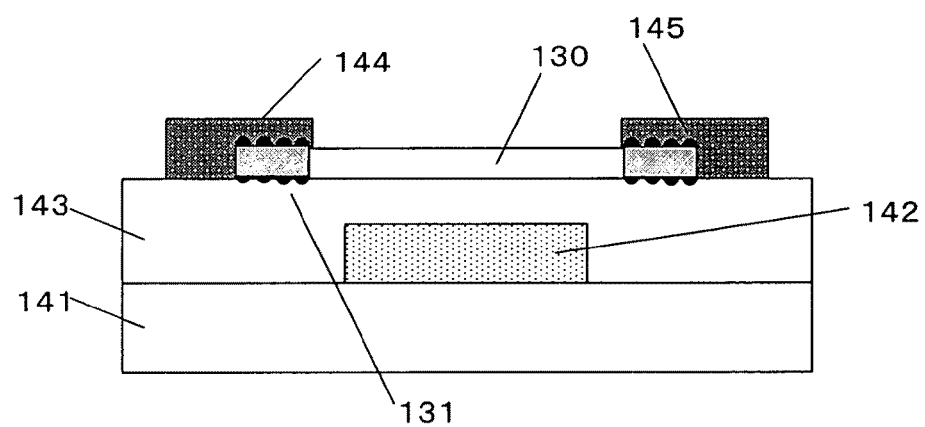

FIGS. 12 and 13 illustrate a transistor 140 that uses contact-doped hetero metal particle coated nanowires 130 as its channel. Hereinafter, the structure of this nanowire transistor 140 will be described.

The nanowire transistor 140 includes source/drain electrodes 144 and 145, which make electrical contact with the contact-doped hetero metal particle coated nanowires 130, and a substrate 141 that supports these members. To keep a good electrical contact between the source/drain electrodes 144, 145 and the contact-doped hetero metal particle coated nanowires 130, the electrical contact is made at the metal particle regions 131 that are doped with a dopant.

On the principal surface of the substrate 141, stacked in this order are a gate electrode 142 and a gate insulating film 143 that electrically insulates the gate electrode 142 from the contact-doped hetero metal particle coated nanowires 130. That is to say, the transistor of this preferred embodiment has a bottom-gate type transistor structure in which the contact-doped hetero metal particle coated nanowires 130 are arranged on the gate insulating film 143.

When a voltage is applied to the gate electrode 142, the conductivity in the channel region of the contact-doped hetero metal particle coated nanowires 130 is controlled through the gate insulating film 143.

The substrate 141 may be a plastic substrate made of polyimide or an aromatic ester, a glass substrate or a sapphire substrate. The gate electrode 142, source electrode 144 and drain electrode 145 may be made of either a metallic material such as titanium, gold, aluminum or nickel or an alloy of a semiconductor material and a metal such as a conductive polymer, polysilicon or titanium silicide.

The transistor of this preferred embodiment is a bottom-gate type. However, a transistor according to the present invention may also a top-gate structure.

In this preferred embodiment, the portions that make electrical contact with the source/drain electrodes are doped with a dopant. However, even if the contact regions are not doped with a dopant, the contact resistance can still be reduced compared to a situation where conventional nanowires are used.

In the nanowire transistor of this preferred embodiment, particles of either a metal or an alloy of a metal and the nanowire material have been formed on the contact regions between the nanowire and the source/drain electrodes. Thus, the contact resistance can be reduced even on a substrate with low thermal resistance. That is why by providing a region where metal particles with very small sizes of about 2 nm to about 10 nm have been formed in a self-organizing manner and a region with no such fine particles for a single nanowire, the transistor can have high current drivability with better contact maintained between the electrodes and the semiconductor layer and without affecting the device performance.

Hereinafter, a method for fabricating a nanowire and a nanowire transistor according to this preferred embodiment will be described.

FIGS. 14(a) through 14(c) illustrate respective process steps for fabricating a nanowire transistor according to this preferred embodiment.

A nanowire manufacturing process according to this preferred embodiment is basically the same as that of the second preferred embodiment described above. In this preferred embodiment, however, the metal particles are made of an alloy of the nanowire material and a metal. To form such alloy particles, the in-chamber pressure and the type of the catalyst metal may be optimized while the metal particle coated nanowire is growing. Alternatively, after the metal particle coated nanowire has been grown, the nanowire may be thermally treated within an arbitrary atmosphere.

The nanowire transistor may be fabricated by a known process except that the metal particle coated nanowires are used. Hereinafter, a method for fabricating a nanowire transistor according to this preferred embodiment will be described.

First, as shown in FIG. 14(a), a gate electrode 142 and a gate insulating film 143 are formed on the principal surface of a substrate 141. The gate electrode 142 may be formed by depositing a gate metal by a sputtering process or an evaporation process in a known thin film deposition system and then patterning the gate metal by photolithographic and etching processes. The gate insulating film 143 may be formed by spin-coating the substrate 141 with a precursor of a gate insulating film material and then by removing the solvent and annealing the substrate. Alternatively, the gate insulating film 143 may also be deposited by a CVD process, a sputtering process or an evaporation process.

Figure 14:
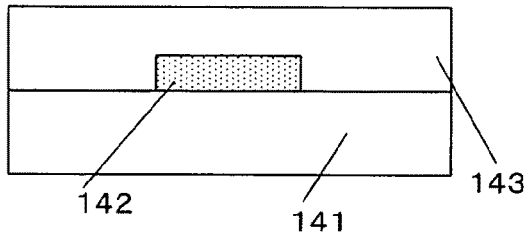
FIGS. 14(a) through 14(c) illustrate respective process steps for fabricating the nanowire transistor of the third preferred embodiment.
Figure 14:
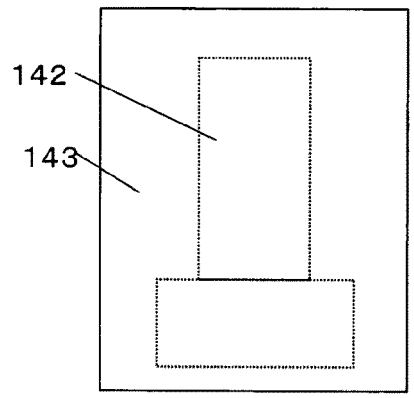
Figure 14:
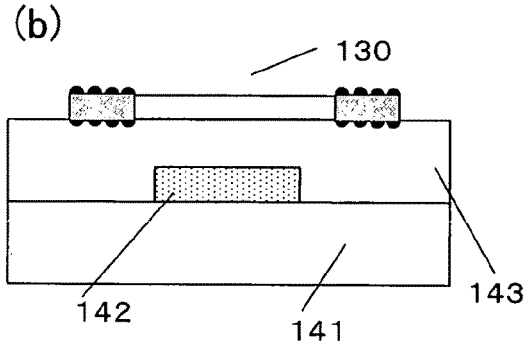
Figure 14:
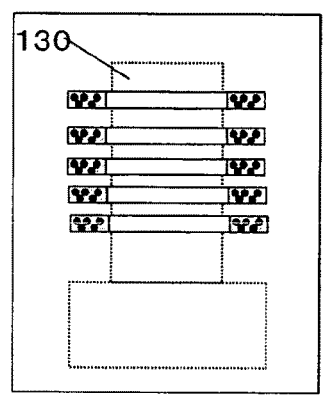
Figure 14:
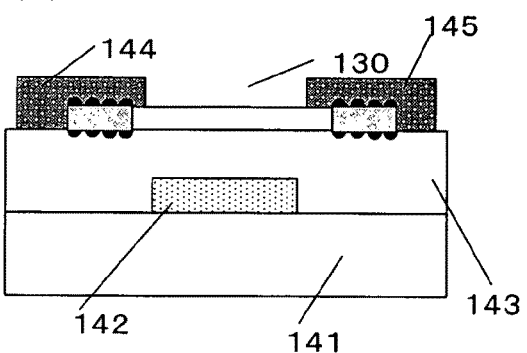
Figure 14:
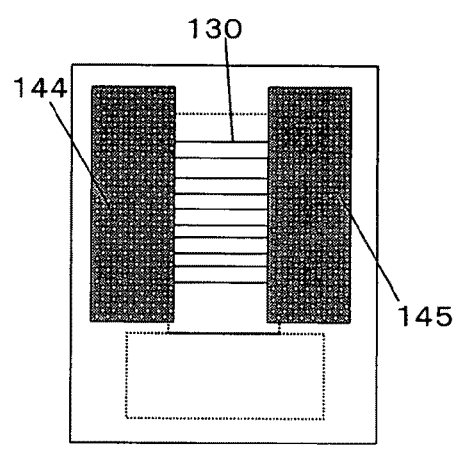

Next, as shown in FIG. 14(b), contact-doped hetero metal particle coated nanowires 130 are arranged on the gate insulating film 143. Specifically, the contact-doped hetero metal particle coated nanowires 130 are stripped from their growing substrate (not shown in FIG. 14) and then dispersed in a solution. Examples of methods of stripping the nanowires from the growing substrate include mechanically stripping the nanowires by subjecting the substrate to ultrasonic vibrations and stripping the nanowires by thinly etching the surface of the substrate.

As a solvent for the dispersant, an aqueous solution, an organic solvent or a mixture of water and an organic solvent may be used. Examples of organic solvents include alcohols such as ethanol, propanol, pentanol, hexanol, and ethyleneglycol, esters such as ethyleneglycolmonoethylether, ketones such as methylethylketone, alkanes such as hexane and octane, and solvents such as tetrahydrofuran and chloroform. As a mixture of water and an organic solvent, a mixture of water and alcohol and a mixture of water and tetrahydrofuran may be used.

Next, a mold with a plurality of grooves in a desired shape is brought into close contact with the upper surface of the gate insulating film 143, and the solution in which the nanowires are dispersed is made to flow through those grooves (which is called a "flow process"). If such a flow process is adopted, the locations and shapes of the nanowires can be controlled with the grooves of the mold, and the direction of the nanowires can be defined by the flow of the liquid. That is to say, the nanowires can be aligned in the molding direction. Optionally, the contact-doped hetero metal particle coated nanowires 130 may also be arranged at desired locations on the substrate 141 by any known method other than the flow process (e.g., by a transfer process).

Thereafter, as shown in FIG. 14(c), source/drain electrodes 144 and 145 are formed. Specifically, a metal film may be deposited and then patterned by photolithographic and etching processes. Alternatively, a liftoff technique may also be adopted.

As described above, according to this preferred embodiment, a metal particle coated nanowire, in which fine metal particles with very small sizes of about 2 nm to about 10 nm have been formed in a self-organizing manner on the surface of the nanowire body, is used, thereby reducing the contact resistance. In addition, since there is no need to perform the process of thermally treating an electrode material and a semiconductor layer material to make an alloy thereof, high-performance transistors can be formed on a substrate with low thermal resistance with their variation reduced.

By providing electrodes that make electrical contact with the fine particles on the nanowire body as described above, various types of electronic devices with very good contact performance can be fabricated. Examples of those electronic devices other than transistors include sensors, light-emitting diodes and photodiodes.

Embodiment 4

Figure 15:
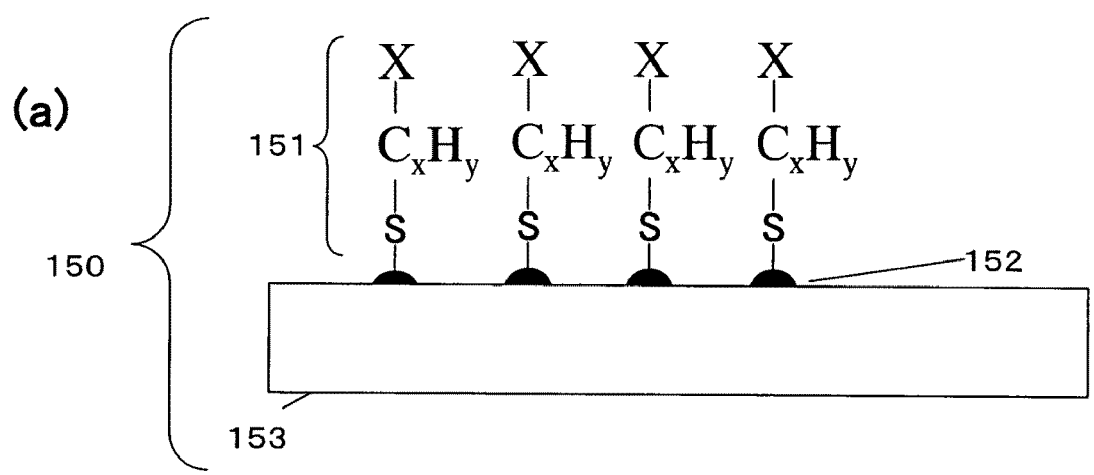
FIGS. 15(a) and 15(b) illustrate the structure of a nanowire sensor according to a fourth preferred embodiment of the present invention.
Figure 15:
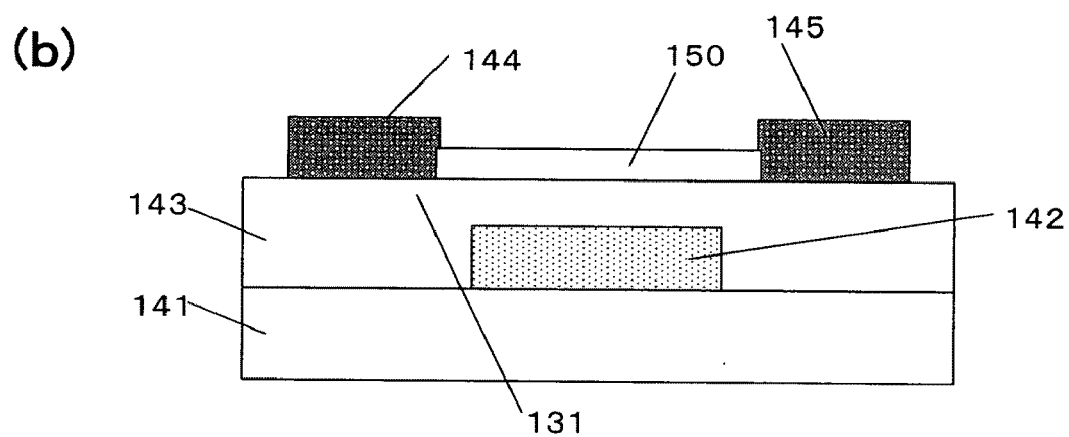

Hereinafter, a preferred embodiment of a sensor including the nanowires of the present invention (which will be referred to herein as a "nanowire sensor") will be described with reference to FIG. 15.

FIG. 15(a) schematically illustrates the surface structure of a nanowire 150, of which the metal particle coated surface is chemically modified with functional molecules (which will be referred to herein as a "chemically modified nanowire"). FIG. 15(b) is a cross-sectional view illustrating the structure of a sensor including such nanowires 150. The chemically modified nanowire 150 shown in FIG. 15(a) includes a semiconductor nanowire body 153, metal particles 152 that have been formed on the surface of the nanowire body 153, and functional molecules 151 that were used for chemical modification. In this preferred embodiment, the metal particles 152 are made of gold. However, the same effect should be achieved even if the metal particles are made of any other metal such as silver, copper or iridium.

The nanowire 150 shown in FIG. 15(a) is characterized in that the metal particles 152 on the surface of the semiconductor nanowire body 153 are chemically modified with the functional molecules 151. Examples of the functional molecules 151 to chemically modify the metal particles 152 include $NH_2(CH_2)_nSH$, $COOH(CH)_nSH$, and $CF_3(CF_2)_n(C_2H_4)_mSH$, where n and m are natural numbers.

The nanowire sensor shown in FIG. 15(b) uses the chemically modified nanowire 150 as a sensing section. The structure of the nanowire sensor may be similar to that of the nanowire transistor of the third preferred embodiment described above. The nanowire sensor of this preferred embodiment includes a gate electrode 142 but may have no gate electrode 142, too.

The nanowire sensor of this preferred embodiment functions as a pH sensor. In a situation where the nanowire 150 is chemically modified with $NH_2(C_6H_6)SH$ as functional molecules, as pH decreases in the solution, the amino group in the functional molecules 151 on the surface of the nanowire 150 turns into $—NH_3^+$. As a result, the conductance between the source and drain electrodes 144 and 145 changes, and therefore, the pH of the solution can be sensed by the drain current flowing through the semiconductor nanowire body 153.

Such a nanowire sensor may be fabricated by the same method as the nanowire transistor of the third preferred embodiment described above.

The sensor of this preferred embodiment functions as a pH sensor. However, by selecting appropriate functional molecules 151, the sensor may function as any other type of sensor. Also, the chemically modified nanowire may be used in not just sensors but also other types of electronic devices as well. For example, if electrical charges are transferred by way of the functional molecules 151, the nanowire may also operate as a memory.

The nanowire sensor of this preferred embodiment can perform a sensing operation by chemically modifying the self-organized metal particles with functional molecules and by getting the analyte adsorbed or reacted to the functional molecules. By using the nanowire of the present invention, the density of the metal particles can be controlled based on the nanowire growth conditions, and therefore, a high sensitivity sensor is realized.

Embodiment 5

Figure 16:
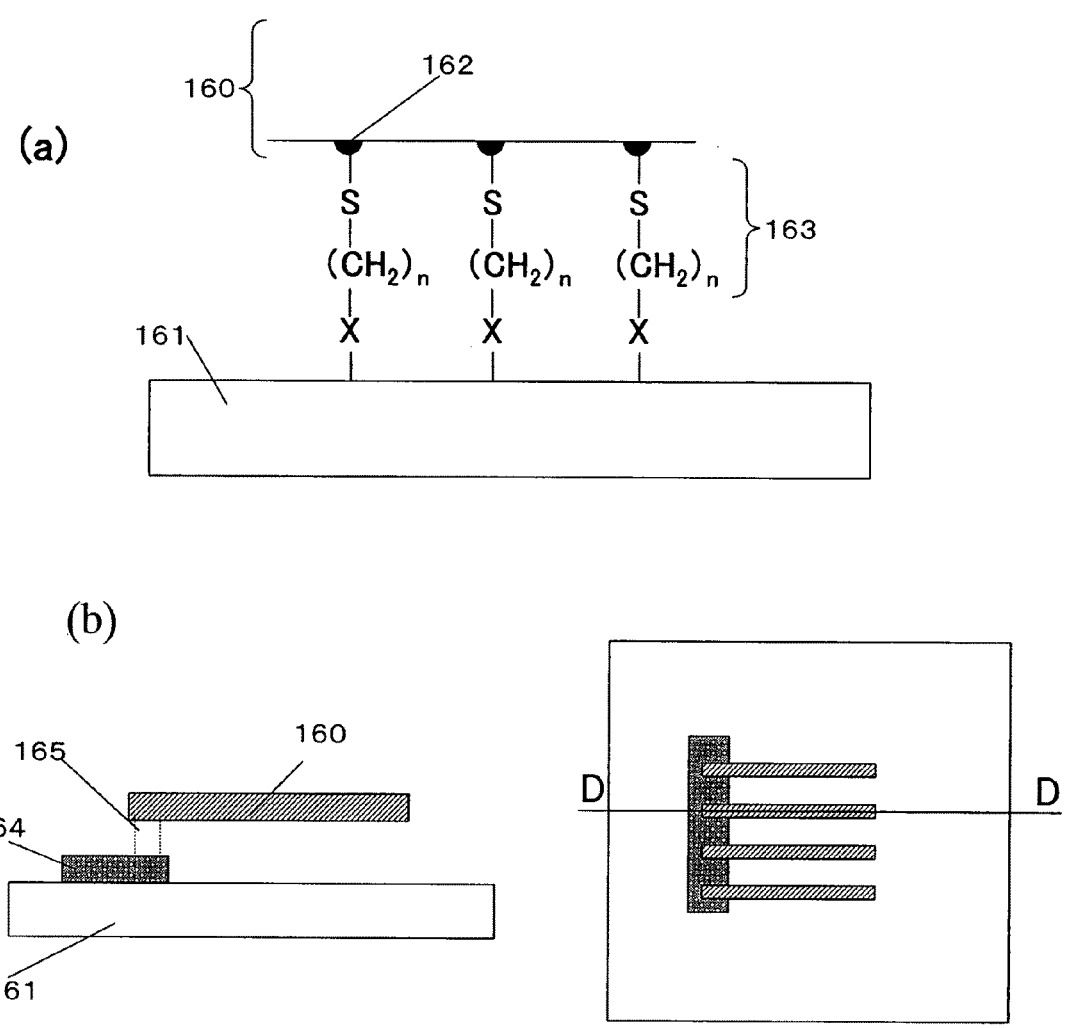
FIG. 16(a) shows a chemically modified nanowire and FIG. 16(b) illustrate nanowires according to a fifth preferred embodiment of the present invention that are arranged at arbitrary locations on a substrate.

Hereinafter, a preferred embodiment of a structure, in which nanowires according to the present invention, including chemically modified metal particles, are arranged on an arbitrary substrate and at arbitrary locations on an electrode, will be described with reference to FIG. 16.

FIG. 16(a) schematically illustrates a chemically modified nanowire 160 and a substrate 161. FIG. 16(b) shows a structure in which the nanowires 160 are arranged at arbitrary locations on an electrode 164 on the substrate 161. Fine particles 162 of gold have been formed on the surface of the nanowires 160 of this preferred embodiment.

The chemically modified nanowire 160 shown in FIG. 16(a) has the same structure as the chemically modified nanowire 150 of the fourth preferred embodiment described above. The chemically modified nanowire 160 of this preferred embodiment is characterized by being chemically bonded to functional groups on the substrate 161.

The functional groups X in the functional molecules that are chemically bonded to the nanowires 160 may be selected from the following combinations.

If the surface of the substrate 161 is —OH, X may be (CH$_3$O)$_3$Si—, (C$_2$H$_5$)$_3$Si—, Cl$_3$Si—, and NCO—. On the other hand, if the surface of the substrate 161 is —NH$_2$ and —NH—, X may be HOOC— and NCO—.

If the hetero metal particle coated nanowire of the second preferred embodiment described above is used, chemical bonds can be produced at arbitrary locations on the nanowire because the metal particles are selectively formed on a particular portion of the semiconductor nanowire.

In the example illustrated in FIG. 16(b), the chemically modified nanowires 160 form a chemical bond with the electrode 164, not with the surface of the substrate 161. In this case, the nanowires 160 preferably have its both ends coated with the metal particles as shown in FIG. 8(b).

To determine where to arrange the nanowires 160, arbitrary portions of the electrode 164 may be chemically modified with functional molecules such as HOOC—(CH$_2$)$_n$—SH, for example. If the nanowires 160 are chemically modified with functional molecules 163 such as NH$_2$—(CH$_2$)$_n$—SH, the arrangement of the nanowires 160 is determined so as to form amide bond between the functional molecules. Consequently, the nanowires 160 can be arranged at arbitrary locations on the electrode 164.

According to a conventional method of arranging nanowires by chemical modification, the catalyst metal portion that is needed to grow the nanowires is bonded to the substrate, and therefore, it is difficult to control the arrangement and direction of the nanowires accurately. However, according to this preferred embodiment, the nanowires can be chemically modified in a broad range in their axial direction, and can be adhered more closely to an object such as the substrate or the electrode. Also, by chemically modifying an arbitrary portion of the object, the arrangement and direction of the chemically modified nanowires 160 can be defined so as to be self-aligned with the object.

Embodiment 6

Figure 17:
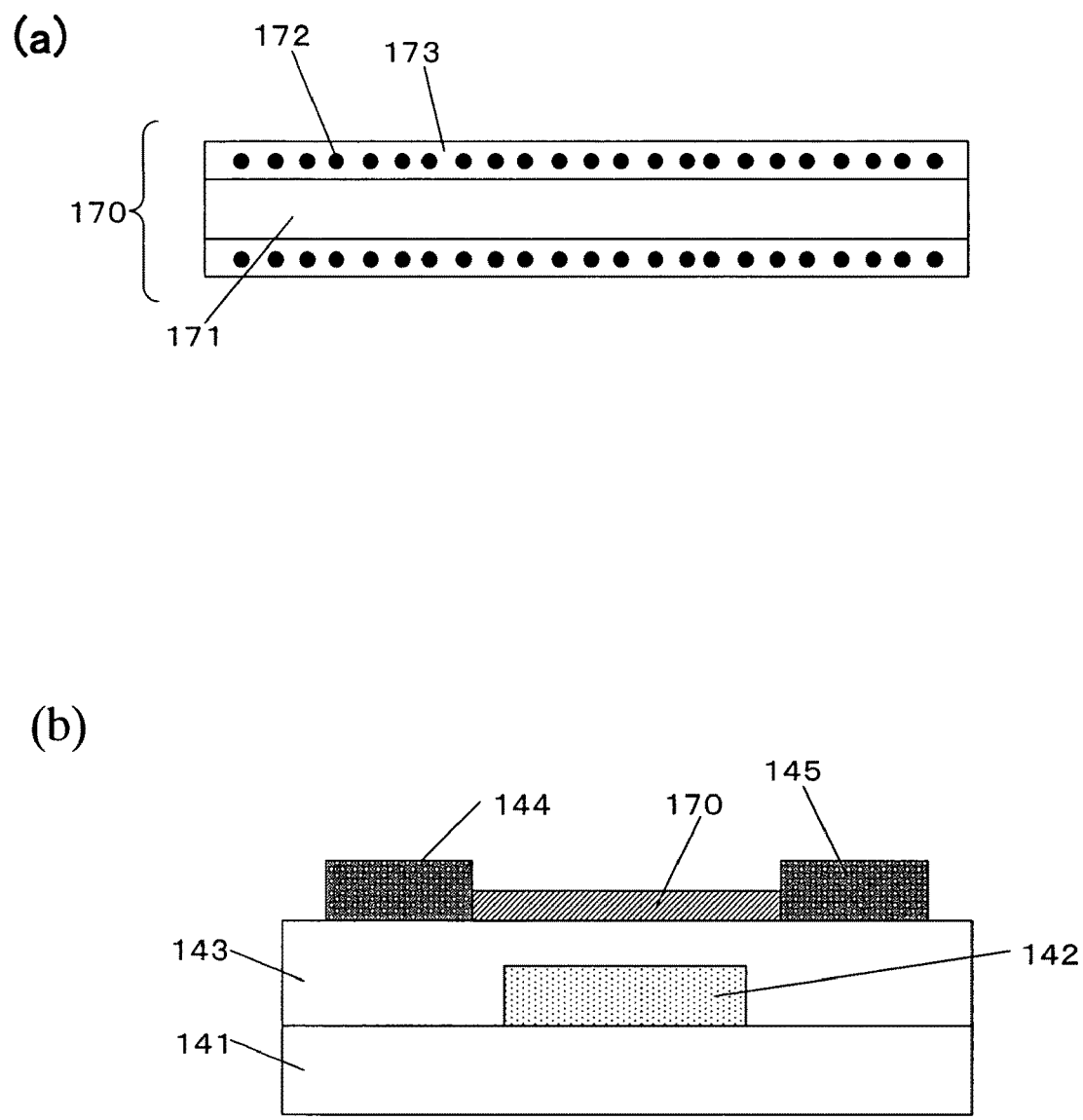
FIG. 17(a) is a cross-sectional view illustrating a nanowire according to a sixth preferred embodiment of the present invention and FIG. 17(b) is a cross-sectional view of a memory device including the nanowire.

Hereinafter, a preferred embodiment of a memory, having the metal particles of the present invention embedded in an insulating film (which will be referred to herein as a "nanowire memory"), will be described with reference to FIG. 17.

FIG. 17(a) illustrates a cross-sectional structure of a nanowire 170 having metal particles embedded in an insulating film, while FIG. 17(b) shows a cross-sectional structure of a nanowire memory that uses such nanowires 170.

The nanowire 170 shown in FIG. 17(a) includes a nanowire 171 coated with an insulating film 173, in which metal particles 172 are embedded. The insulating film 173 may be made of a silicon oxide, a silicon nitride or a hafnium oxide, for example.

The nanowire 170 may be fabricated by covering the metal particle coated nanowire described above with an insulating film 173 by a sputtering process or a laser ablation process and then thermally treating the nanowire such that the metal particles 172 diffuse into the insulating film 173.

If a gold dot coated Si nanowire is used, then the nanowire may be oxidized within an oxygen atmosphere. In this manner, a nanowire, including gold particles that are embedded in a silicon dioxide film, can be obtained.

The nanowire memory shown in FIG. 17(b) includes the nanowire 170 in which the metal particles 172 are embedded in the insulating film 173. But, other than that, the memory basically has the same structure as the nanowire transistor of the third preferred embodiment described above. The memory may be operated by injecting electrical charges from the nanowire 171 into the metal particles 172 with a bias voltage applied to the gate electrode 142. Conversely, by applying an inverse bias voltage to the gate electrode 142, electrical charges may also be injected from the metal particles 142 to the nanowire 171.

The nanowire memory shown in FIG. 17(b) may also be fabricated by the same method as the nanowire transistor of the third preferred embodiment described above.

The nanowire memory of this preferred embodiment achieves high accuracy by applying a nanowire, in which the self-organized metal particles 172 of the present invention have been embedded in the insulating film 173, to a memory. In addition, by using the nanowire of the present invention, the density of the metal particles 172 can be controlled based on the growth conditions. As a result, the variation in particle density can be reduced and a memory with improved accuracy is realized.

Embodiment 7

Hereinafter, a preferred embodiment of an electronic device according to the present invention will be described with reference to FIGS. 18 and 19. The electronic device of this preferred embodiment is a display with organic electroluminescent (organic EL) elements.

Figure 18:
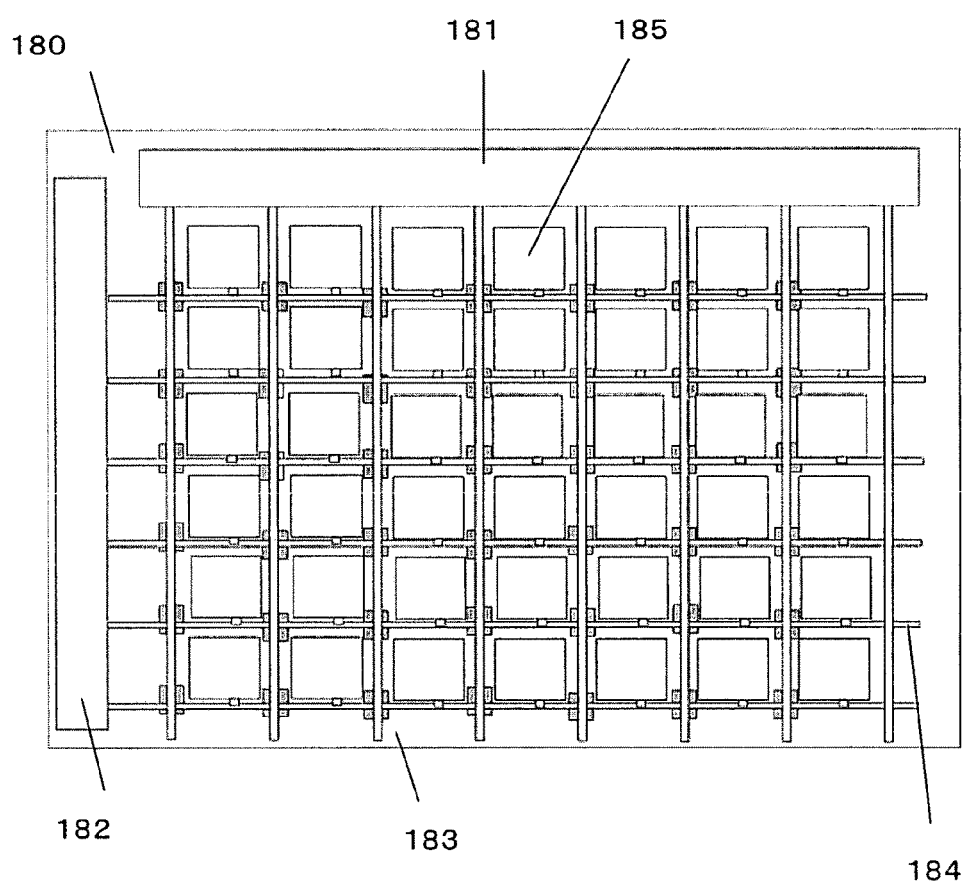
FIG. 18 schematically illustrates an organic EL display according to a seventh preferred embodiment of the present invention.

FIG. 18 schematically shows the configuration of the display. In the display shown in FIG. 18, a number of pixels 185 are arranged in matrix on a substrate 180. An organic EL element is arranged near each of those pixels 185 and is controlled by a circuit including a TFT, which is arranged near the organic EL element. On the substrate 180, arranged are X-scan electrodes 183, Y-scan electrodes 184, an X-driver 181 and a Y-driver 182 in order to control the TFTs.

Figure 19:
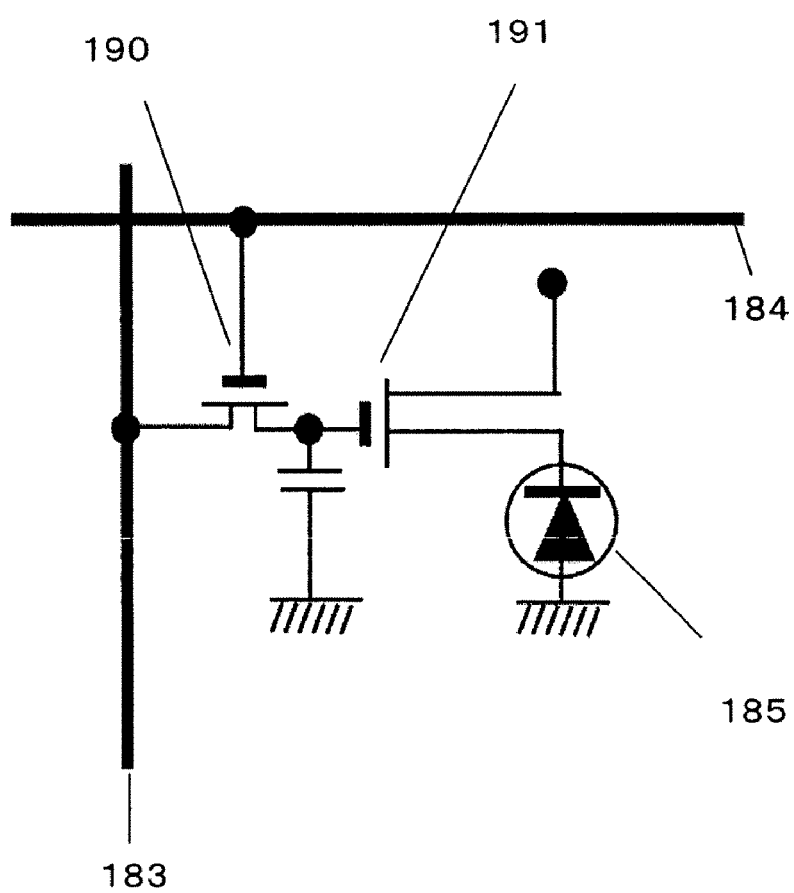
FIG. 19 is a circuit diagram showing a transistor to drive a pixel according to the seventh preferred embodiment.
Figure 20:
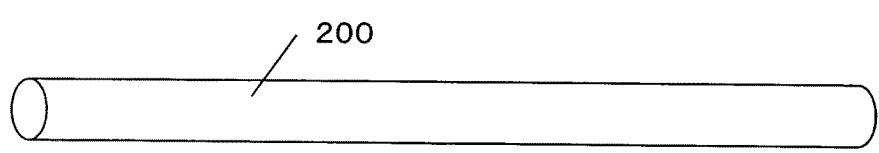
FIGS. 20(a) through 20(c) schematically illustrate the structures of conventional nanowires.
Figure 20:
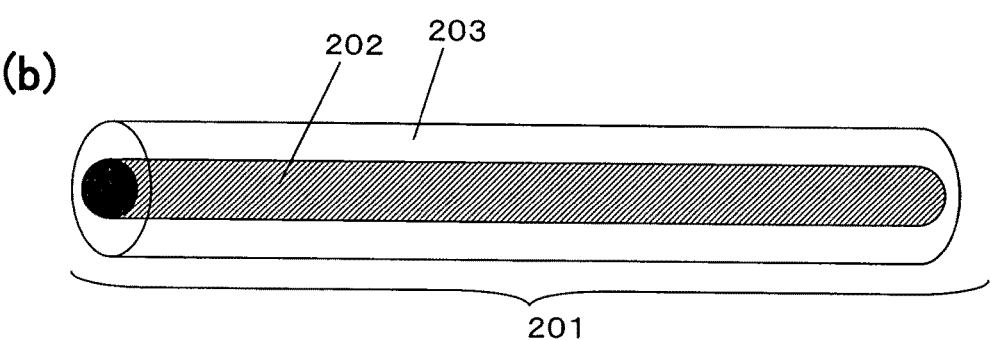
Figure 20:
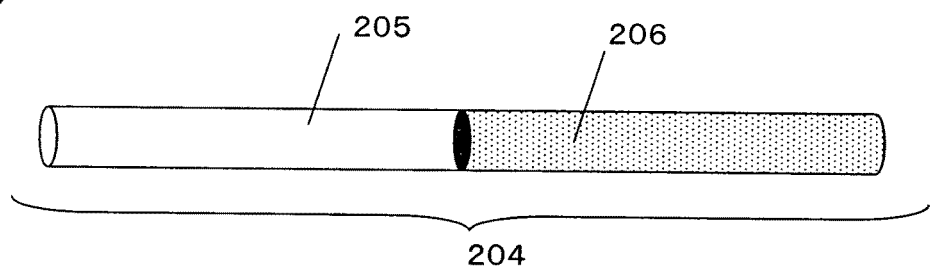

FIG. 19 is a circuit diagram showing a pixel and its surrounding circuit components. The pixel 185 is controlled by a switching transistor 190 and a driver transistor 191, both of which include the nanowire of the present invention.

A voltage is applied from the Y-driver 182 to the source electrode of the switching transistor 190 through the Y-scan electrode 184. The drain electrode of the switching transistor 190 and the gate electrode of the driver transistor 191 are electrically connected together. The drain electrode of the driver transistor 191 is electrically connected to a pixel electrode (not shown), which is arranged in the lower portion of the pixel. A voltage for making the pixel produce light is applied to the source electrode of the driver transistor 191.

On the other hand, a pixel signal voltage is applied from the X-driver 181 to the gate electrode of the switching transistor 190 through the X-scan electrode 183. The switching transistor 190, to which the pixel signal voltage has been applied, in turn applies a voltage to the gate electrode of the driver transistor 191. As a result, a voltage is applied from the driver transistor to the pixel electrode. Although not shown, a transparent electrode is arranged over the pixel. And when a voltage is applied between the pixel electrode and the transparent electrode, the pixel portion emits electroluminescence.

The electronic device of the present invention does not have to be such a display but may also be an LCD or any other type of electronic device. The nanowire of the present invention may be used in any of those various types of electronic devices.

The nanowire of the present invention can be fabricated easily by a simple manufacturing process and is broadly applicable to electronic devices, including transistors and memories, and to micro devices.

What is claimed is:

1. A nanowire comprising:
   a nanowire body made of a crystalline semiconductor as a first material; and
   a plurality of fine particles, which are made of a second material, including a constituent element of the semiconductor, and which are located on at least portions of the surface of the nanowire body,
   wherein the surface of the nanowire body is smooth.

2. The nanowire of claim 1, wherein at least those portions of the smooth surface of the nanowire body, which are in contact with the fine particles, have substantially no oxide film.

3. The nanowire of claim 1, wherein the nanowire has an average diameter of 1 nm to 1 μm.

4. The nanowire of claim 1, wherein the fine particles are dispersed over the entire surface of the nanowire body.

5. The nanowire of claim 1, wherein the surface of the nanowire body includes a first region in which the fine particles are dispersed and a second region in which the fine particles have not been formed.

6. The nanowire of claim 1, wherein the fine particles include at least one type of metallic element.

7. The nanowire of claim 6, wherein the fine particles are made of either a metal or an alloy of the metal and the first material.

8. The nanowire of claim 1, wherein the second material includes at least one metal that is selected from the group consisting of gold, silver, copper and iridium.

9. The nanowire of claim 1, wherein the fine particles have a mean particle size of less than 20 nm.

10. The nanowire of claim 1, wherein the nanowire body is single crystalline.

11. The nanowire of claim 1, wherein the first material includes at least one material that is selected from the group consisting of silicon, germanium and carbon.

12. A field effect transistor including the nanowire of claim 1, the transistor comprising:
    a channel region, which is defined in the nanowire;
    electrodes, which are connected to the nanowire and which function as source and drain regions;
    a gate electrode for controlling conductivity in at least a portion of the channel region; and
    a gate insulating film for electrically insulating the gate electrode from the channel region.

13. The field effect transistor of claim 12, wherein at least some of the fine particles on the surface of the nanowire are in contact with the electrodes.

14. The field effect transistor of claim 13, wherein portions of the nanowire that are in contact with the electrodes are doped with a dopant.

15. The nanowire of claim 1, wherein the fine particles are chemically modified with functional molecules.

16. The nanowire of claim 15, wherein the functional molecules include —SH groups at sites where the molecules are bonded to the fine particles.

17. The nanowire of claim 16, wherein the functional molecules are $X—(C_nH_m)—SH$ (where n and m are natural numbers) and X is $—NH_2$, $—COOH$, $—C_xH_y$ or $—C_aF_b$ (where x, y, a and b are natural numbers).

18. A sensor comprising:
    the nanowire of claim 1 functioning as a sensing section; and
    first and second electrodes connected to the nanowire.

19. An electronic device comprising:
    the nanowire of claim 15; and
    a member that is chemically bonded to the nanowire via the functional molecules.

20. An electronic device comprising the nanowire of claim 1.

21. The electronic device of claim 20, comprising an electrode that contacts with the fine particles of the nanowire.

* * * * *